(12) United States Patent
Varga et al.

(10) Patent No.: US 8,360,312 B2
(45) Date of Patent: *Jan. 29, 2013

(54) METAL-CONTAINING TRANSACTION CARD AND METHOD OF MAKING THE SAME

(75) Inventors: Stevan Varga, East Sussex (GB); Lisa Ann Morrill Webb, West Sussex (GB)

(73) Assignee: American Express Travel Releated Services Company, Inc., New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/462,465

(22) Filed: May 2, 2012

(65) Prior Publication Data

US 2012/0204419 A1    Aug. 16, 2012

Related U.S. Application Data

(63) Continuation of application No. 13/228,772, filed on Sep. 9, 2011, now Pat. No. 8,186,582, which is a continuation of application No. 12/538,745, filed on Aug. 10, 2009, now Pat. No. 8,033,457, which is a continuation-in-part of application No. 12/125,750, (Continued)

(51) Int. Cl.
*G06K 5/00* (2006.01)
(52) U.S. Cl. .................... 235/380; 235/487; 235/488
(58) Field of Classification Search .................. 235/380, 235/375, 492, 487, 488, 449
See application file for complete search history.

(56) References Cited

U.S. PATENT DOCUMENTS

| | | | |
|---|---|---|---|
| 3,468,046 | A | 9/1969 | Shoji |
| 3,537,195 | A | 11/1970 | Gerds |
| 3,583,317 | A | 6/1971 | Gibson |
| 3,668,046 | A | 6/1972 | Bosse |
| 4,058,839 | A | 11/1977 | Darjany |
| 4,222,516 | A | 9/1980 | Badet et al. |
| D264,853 | S | 6/1982 | Scavino et al. |
| 4,398,985 | A | 8/1983 | Eagon et al. |
| 4,417,138 | A | 11/1983 | Pfeiffer |
| 4,417,413 | A | 11/1983 | Hoppe |
| 4,434,361 | A | 2/1984 | Meinguss et al. |
| 4,542,288 | A | 9/1985 | Drexler |

(Continued)

FOREIGN PATENT DOCUMENTS

| | | |
|---|---|---|
| DE | 3130213 | 2/1983 |
| EP | 0298687 | 7/1988 |

(Continued)

OTHER PUBLICATIONS

U.S. Appl. No. 13/228,772, filed Sep. 9, 2011.

(Continued)

*Primary Examiner* — Edwyn Labaze
(74) *Attorney, Agent, or Firm* — Snell & Wilmer L.L.P.

(57) ABSTRACT

A method of creating a single transaction card is disclosed and comprises embossing the single transaction card within a pocket to form embossed characters on a first surface of the single transaction card, filling the pocket with a fill panel to provide a substantially flush surface on a second surface of the single transaction card, wherein a third surface of the fill panel is in uniform, direct contact with an interior of the pocket. Another method is disclosed for machining a face pocket within a single transaction card and disposing a microchip therein. In various embodiments, a single transaction card is comprised of a continuous metal layer, such as, for example, titanium.

20 Claims, 13 Drawing Sheets

Related U.S. Application Data filed on May 22, 2008, now Pat. No. 7,823,777, which is a continuation-in-part of application No. 11/044,662, filed on Jan. 27, 2005, now Pat. No. 7,588,184, which is a continuation-in-part of application No. 10/749,006, filed on Dec. 30, 2003, now Pat. No. 7,530,491.

(60) Provisional application No. 60/437,938, filed on Jan. 3, 2003.

(56) References Cited

U.S. PATENT DOCUMENTS

| | | |
|---|---|---|
| 4,544,835 A | 10/1985 | Drexler |
| 4,565,922 A | 1/1986 | Anderson |
| 4,620,727 A | 11/1986 | Stockburger et al. |
| 4,677,285 A | 6/1987 | Taniguchi |
| 4,707,594 A | 11/1987 | Roth |
| 4,725,924 A | 2/1988 | Juan |
| 4,745,267 A | 5/1988 | Davis et al. |
| 4,747,620 A | 5/1988 | Kay et al. |
| 4,754,128 A | 6/1988 | Takeda et al. |
| 4,786,791 A | 11/1988 | Hodama |
| 4,788,102 A | 11/1988 | Koning et al. |
| 4,812,633 A | 3/1989 | Vogelgesang et al. |
| 4,826,772 A | 5/1989 | Meathrel |
| 4,849,618 A | 7/1989 | Namikawa et al. |
| 4,851,610 A | 7/1989 | LeBlanc et al. |
| 4,876,441 A | 10/1989 | Hara et al. |
| 4,889,755 A | 12/1989 | Charbonneau |
| 4,897,533 A | 1/1990 | Lyszczarz |
| 4,900,111 A | 2/1990 | D'Amato et al. |
| 4,918,631 A | 4/1990 | Hara et al. |
| 4,923,471 A | 5/1990 | Morgan |
| 4,938,830 A | 7/1990 | Cannistra |
| 5,049,728 A | 9/1991 | Rovin |
| 5,173,844 A | 12/1992 | Adachi et al. |
| 5,206,494 A | 4/1993 | Metzger |
| 5,217,056 A | 6/1993 | Ritter |
| 5,279,019 A | 1/1994 | Knickle |
| 5,286,958 A | 2/1994 | Smeets |
| 5,299,940 A | 4/1994 | Uenaka et al. |
| 5,300,169 A | 4/1994 | Tahara |
| 5,309,840 A | 5/1994 | Takamura et al. |
| 5,336,871 A | 8/1994 | Colgate |
| 5,356,717 A | 10/1994 | Choki et al. |
| 5,410,136 A | 4/1995 | McIntire et al. |
| 5,421,618 A | 6/1995 | Okazaki et al. |
| 5,437,897 A | 8/1995 | Tanaka et al. |
| 5,444,225 A | 8/1995 | Takahashi et al. |
| 5,451,763 A | 9/1995 | Pickett et al. |
| 5,492,370 A | 2/1996 | Chatwin et al. |
| 5,514,240 A | 5/1996 | Hagiiiri-teiirani et al. |
| 5,525,400 A | 6/1996 | Manser et al. |
| 5,559,370 A | 9/1996 | Berney |
| 5,569,898 A | 10/1996 | Fisher et al. |
| 5,582,103 A | 12/1996 | Tanaka et al. |
| 5,608,203 A | 3/1997 | Finkelstein et al. |
| 5,713,406 A | 2/1998 | Drury |
| 5,746,451 A | 5/1998 | Weyer |
| 5,748,737 A | 5/1998 | Daggar |
| 5,793,502 A | 8/1998 | Bianco et al. |
| 5,839,763 A | 11/1998 | McCannel |
| 5,844,230 A | 12/1998 | Lalonde |
| 5,877,941 A | 3/1999 | Ryu |
| 5,918,788 A | 7/1999 | Moorman et al. |
| 5,928,788 A | 7/1999 | Riedl |
| 5,944,356 A | 8/1999 | Bergmann et al. |
| RE36,356 E | 10/1999 | Gloton et al. |
| 5,969,951 A | 10/1999 | Fischer et al. |
| 5,986,550 A | 11/1999 | Rapaport et al. |
| 5,988,503 A | 11/1999 | Kuo |
| 5,997,042 A | 12/1999 | Blank |
| 6,006,456 A | 12/1999 | Hiromachi et al. |
| 6,025,283 A | 2/2000 | Roberts |
| 6,079,621 A | 6/2000 | Vardanyan et al. |
| 6,116,655 A | 9/2000 | Thouin et al. |
| 6,121,069 A | 9/2000 | Boyko et al. |
| 6,146,741 A | 11/2000 | Ogawa et al. |
| 6,164,548 A | 12/2000 | Curiel |
| 6,179,338 B1 | 1/2001 | Bergmann et al. |
| 6,250,555 B1 | 6/2001 | Inamoto |
| 6,291,877 B1 | 9/2001 | Usami |
| 6,294,241 B1 | 9/2001 | Kaule et al. |
| 6,328,342 B1 | 12/2001 | Belousov et al. |
| 6,337,752 B1 | 1/2002 | Heckenkamp et al. |
| 6,373,965 B1 | 4/2002 | Liang |
| 6,382,506 B1 | 5/2002 | Van Der Valk |
| 6,382,677 B1 | 5/2002 | Kaule et al. |
| 6,398,114 B1 | 6/2002 | Nishikawa et al. |
| 6,471,127 B2 | 10/2002 | Pentz et al. |
| 6,471,128 B1 | 10/2002 | Corcoran et al. |
| 6,482,330 B1 | 11/2002 | Bajorek |
| 6,491,782 B1 | 12/2002 | Jaynes |
| 6,492,717 B1 | 12/2002 | Gore et al. |
| 6,533,180 B1 | 3/2003 | Wood |
| 6,644,551 B2 | 11/2003 | Clayman et al. |
| 6,651,891 B1 | 11/2003 | Zakel et al. |
| 6,655,719 B1 | 12/2003 | Curiel |
| 6,672,525 B2 | 1/2004 | Koike et al. |
| 6,677,105 B2 | 1/2004 | Wang et al. |
| 6,715,797 B2 | 4/2004 | Curiel |
| 6,726,813 B2 | 4/2004 | Kaule et al. |
| 6,734,887 B2 | 5/2004 | Field |
| 6,749,123 B2 | 6/2004 | Lasch et al. |
| 6,764,014 B2 | 7/2004 | Lasch et al. |
| 6,832,730 B2 | 12/2004 | Conner et al. |
| 6,886,246 B2 | 5/2005 | Chung |
| 6,924,867 B2 | 8/2005 | Hinata |
| 6,942,156 B2 | 9/2005 | Ohta et al. |
| 7,036,739 B1 | 5/2006 | Mann et al. |
| 7,063,924 B2 | 6/2006 | Kaminsky et al. |
| 7,306,163 B2 | 12/2007 | Scholz et al. |
| 7,375,975 B1 | 5/2008 | Jang et al. |
| 7,377,446 B2 | 5/2008 | Ohta et al. |
| 7,461,791 B2 | 12/2008 | Keshura |
| 7,479,320 B2 | 1/2009 | Keller et al. |
| 7,494,057 B2 | 2/2009 | Lasch et al. |
| 7,530,491 B2 | 5/2009 | Lasch et al. |
| 7,588,184 B2 | 9/2009 | Gandel et al. |
| 7,819,310 B2 | 10/2010 | Lasch et al. |
| 7,823,777 B2 | 11/2010 | Varga et al. |
| 7,971,786 B2 | 7/2011 | Lasch et al. |
| 2002/0070279 A1 | 6/2002 | Zausner |
| 2002/0117846 A1 | 8/2002 | Kaule et al. |
| 2002/0179463 A1* | 12/2002 | Newman .................. 206/234 |
| 2002/0185561 A1 | 12/2002 | Koike et al. |
| 2003/0024995 A1 | 2/2003 | Conner et al. |
| 2003/0043485 A1 | 3/2003 | Conner et al. |
| 2003/0047253 A1 | 3/2003 | Robinson et al. |
| 2003/0102541 A1 | 6/2003 | Gore |
| 2003/0150762 A1 | 8/2003 | Biller |
| 2003/0202151 A1 | 10/2003 | Hinata |
| 2004/0026518 A1 | 2/2004 | Kudo et al. |
| 2004/0108504 A1 | 6/2004 | Forbes et al. |
| 2004/0121257 A1 | 6/2004 | Kaminsky et al. |
| 2004/0159709 A1 | 8/2004 | Ohta et al. |
| 2004/0217178 A1 | 11/2004 | Lasch et al. |
| 2005/0012326 A1 | 1/2005 | Keller et al. |
| 2005/0156318 A1 | 7/2005 | Douglas |
| 2005/0178827 A1 | 8/2005 | Shatford |
| 2005/0194453 A1 | 9/2005 | Conner et al. |
| 2005/0283839 A1 | 12/2005 | Cowburn |
| 2006/0119534 A1 | 6/2006 | Semba et al. |
| 2006/0124753 A1 | 6/2006 | Scholz et al. |
| 2006/0144952 A1 | 7/2006 | Kluge |
| 2006/0214008 A1 | 9/2006 | Asami et al. |

FOREIGN PATENT DOCUMENTS

| | | |
|---|---|---|
| EP | 0552047 | 1/1993 |
| JP | 63154269 | 10/1988 |
| KR | 0006339 | 8/1992 |
| WO | 2004063977 | 7/2004 |
| WO | 2006081385 | 8/2006 |

OTHER PUBLICATIONS

U.S. Appl. No. 12/538,745, filed Aug. 10, 2009.
U.S. Appl. No. 12/125,750, filed May 22, 2008.
U.S. Appl. No. 11/044,662, filed Jan. 27, 2005.
U.S. Appl. No. 10/749,006, filed Dec. 30, 2003.
International Search Report and Written Opinion for PCT/US08/79016 dated Dec. 5, 2008.
www.saltlakesilver.com, Titanium ring, titanium wedding bands, silver rings, sterling silver rings, wedding bands, pp. 1-2.
www.amazon.com, price search for silver ring, Jan. 18, 2007, pp. 1-4.
International Search Report for PCT/US03/41641 dated Jul. 23, 2004.
International Search Report for PCT/US2006/002864 dated May 18, 2006.
IBM Technical Disclosure Bulletin.
Notice of Allowance for U.S. Appl. No. 11/713,968 mailed Oct. 23, 2008.
Notice of Allowance for U.S. Appl. No. 11/044,662 dated Jul. 31, 2009.
Notice of Allowance for U.S. Appl. No. 10/749,006 mailed Mar. 10, 2009.
Non-Final Office Action for U.S. Appl. No. 12/125,750 dated Aug. 3, 2010.
Notice of Allowance for U.S. Appl. No. 12/125,750 dated Sep. 10, 2010.
Notice of Allowance for U.S. Appl. No. 12/429,335 dated Jul. 23, 2010.
International Search Report and Written Opinion for PCT/US2010/044848 dated Oct. 20, 2010.
Non-Final Office Action for U.S. Appl. No. 12/911,165 dated Jan. 7, 2011.
Notice of Allowance for U.S. Appl. No. 12/911,165 dated Mar. 4, 2011.
Non-Final Office Action for U.S. Appl. No. 12/538,745 dated May 3, 2011.
www.amazon.com, price search for titanium ring, Jan. 18, 2007, pp. 1-4.
Notice of Allowance for U.S. Appl. No. 12/538,745 dated Jun. 20, 2011.
Notice of Allowance dated Aug. 8, 2011 in Canadian Application No. 2,512,086.
Non-Final Office Action for U.S. Appl. No. 13/166,932 dated Sep. 16, 2011.
Examiner's Report dated Sep. 28, 2011 in Chilean Application No. 1272-2009.
Notice of Allowance dated Oct. 21, 2011 in U.S. Appl. No. 13/166,932.
International Preliminary Report on Patentability dated Oct. 25, 2011 in Application No. PCT/US2008/079016.
Examiner's First Report dated Nov. 21, 2011 Australian Application No. 2008356532.
NZ; Examiner's Report dated Dec. 14, 2011 in Application No. 589541.
Notice of Allowance dated Feb. 3, 2012 in U.S. Appl. No. 13/228,772.
CH; Examiner's Final Report dated Feb. 3, 2012 in Application No. 1272-2009.
KR; Provisional Rejection dated Feb. 15, 2012 in Application No. 10-2010-7028089.
USPTO; Office Action dated Dec. 7, 2011 in U.S. Appl. No. 13/228,772.

* cited by examiner

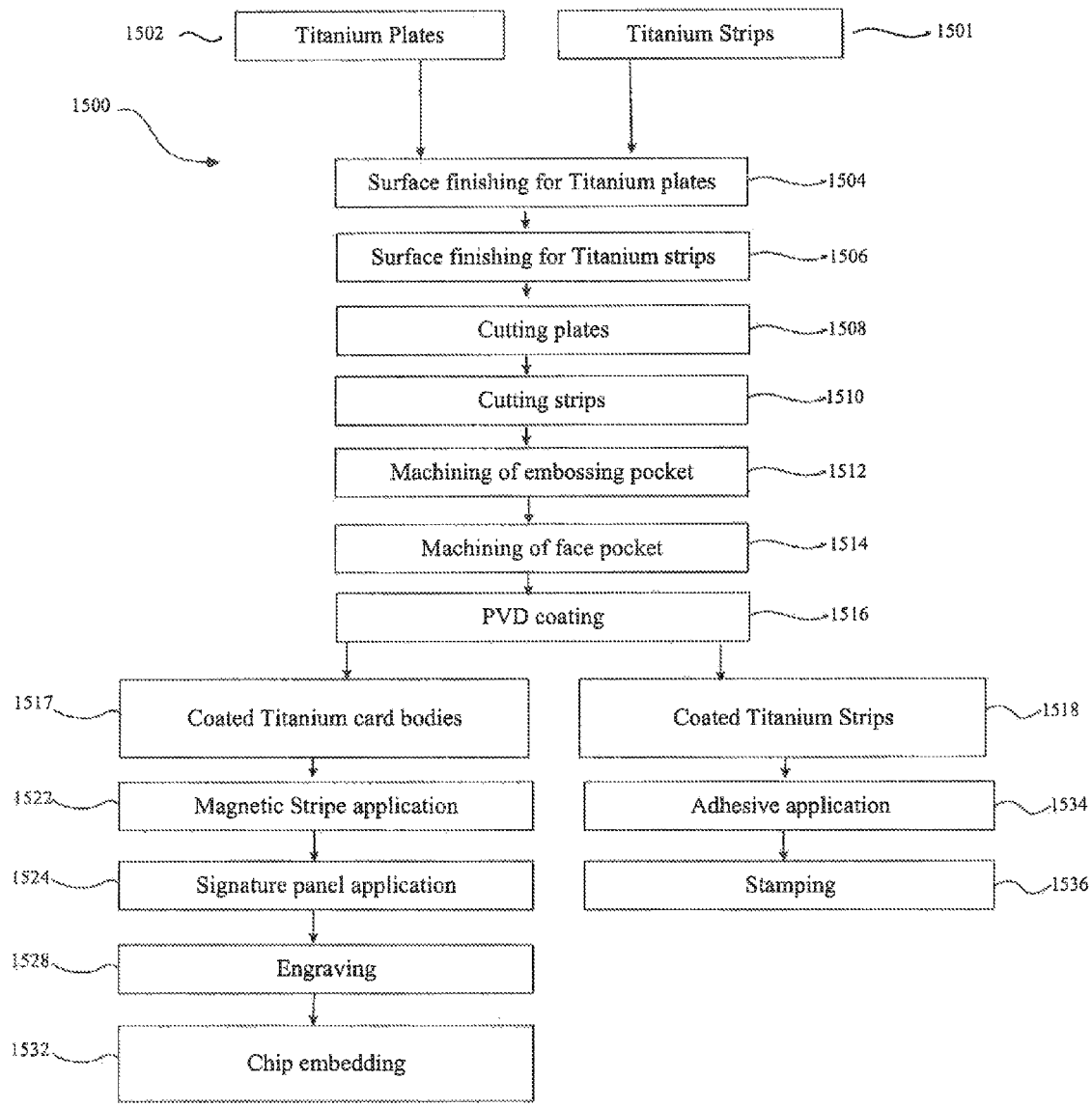

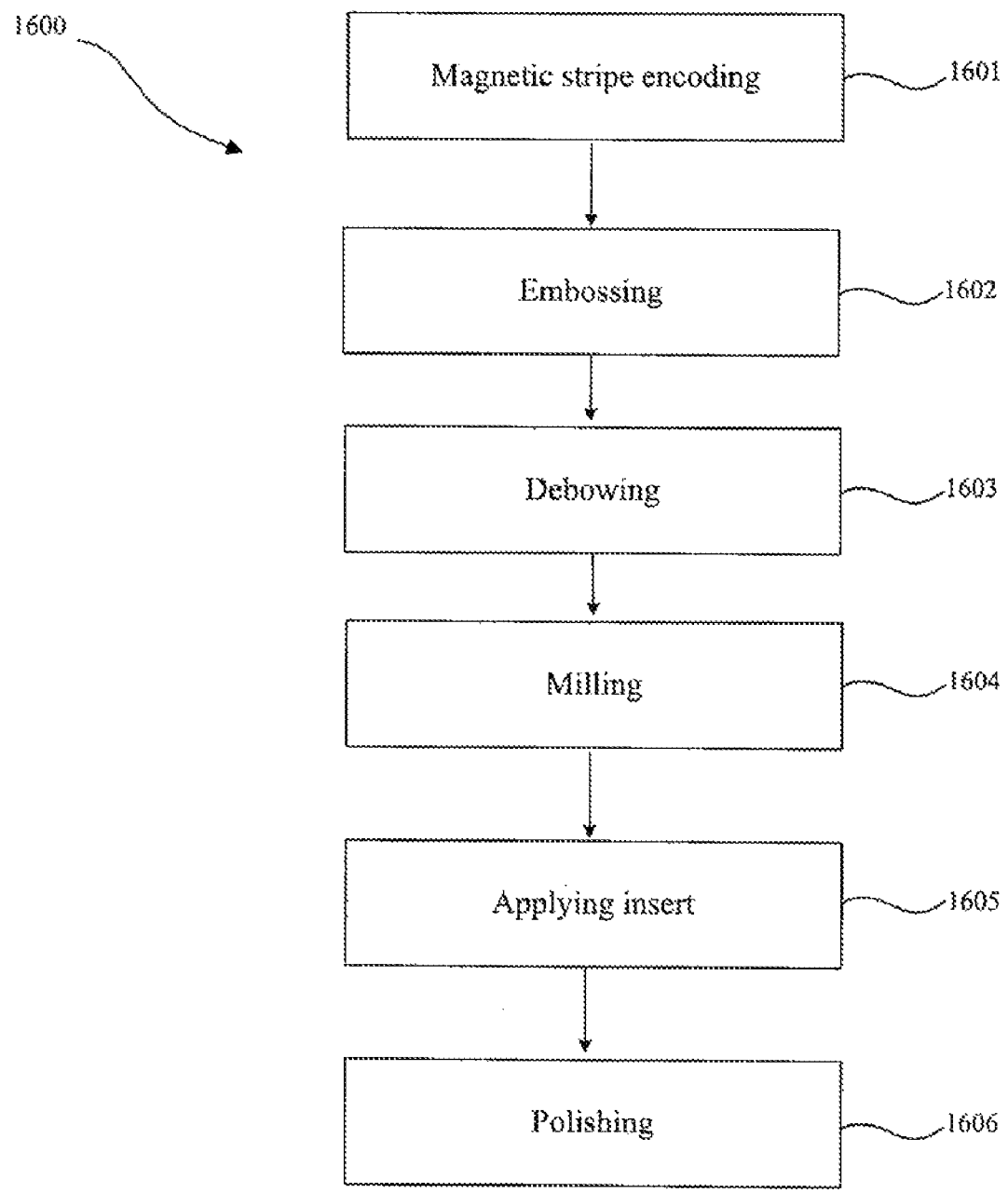

METAL-CONTAINING TRANSACTION CARD AND METHOD OF MAKING THE SAME

CROSS-REFERENCE TO RELATED APPLICATIONS

This application is a continuation of U.S. patent application Ser. No. 13/228,772, filed Sep. 9, 2011 and entitled "METAL-CONTAINING TRANSACTION CARD AND METHOD OF MAKING THE SAME." The '772 application is a continuation of U.S. patent application Ser. No. 12/538,745 filed Aug. 10, 2009, which issued as U.S. Pat. No. 8,033,457 on Oct. 11, 2011 and entitled "METAL-CONTAINING TRANSACTION CARD AND METHOD OF MAKING THE SAME." The '745 application is a continuation-in-part of U.S. Pat. No. 7,823,777 issued on Nov. 12, 2010 (aka U.S. Ser. No. 12/125,750 entitled "Metal-Containing Transaction Card and Method of Making the Same" filed May 22, 2008). The '750 application is a continuation-in-part of U.S. Pat. No. 7,588,184 issued on Sep. 15, 2009 (aka U.S. Ser. No. 11/044,662 entitled "Metal-Containing Transaction Card and Method of Making the Same" filed Jan. 27, 2005). The '662 application is a continuation-in-part of U.S. Pat. No. 7,530,491 issued May 12, 2009 (aka U.S. Ser. No. 10/749,006 entitled "Metal-Containing Transaction Card and Method of Making the Same" filed Dec. 30, 2003). The '006 application claims priority to U.S. Provisional Patent Application Ser. No. 60/437,938, filed Jan. 3, 2003. All of the above-referenced applications are hereby incorporated by reference herein in their entirety.

FIELD OF INVENTION

The invention generally includes metal-containing transaction cards useful for the purchase of goods and/or services and methods of making the same. The cards may include other features such as a microchip (e.g., smart card) disposed in a face pocket of a transaction card, an antenna and a backplate or fill panel.

BACKGROUND OF THE INVENTION

The proliferation of transaction cards, which allow the cardholder to pay with credit rather than cash, started in the United States in the early 1950s. Initial transaction cards were typically restricted to select restaurants and hotels and were often limited to an exclusive class of individuals. Since the introduction of plastic credit cards, the use of transaction cards have rapidly proliferated from the United States, to Europe, and then to the rest of the world. Transaction cards are not only information carriers, but also typically allow a consumer to pay for goods and services without the need to constantly possess cash, or if a consumer needs cash, transaction cards allow access to funds through an automatic teller machine (ATM). Transaction cards also reduce the exposure to the risk of cash loss through theft and reduce the need for currency exchanges when traveling to various foreign countries. Due to the advantages of transaction cards, hundreds of millions of cards are now produced and issued annually, thereby resulting in a need for companies to differentiate their cards from competitor's cards.

Initially, the transaction cards often included the issuer's name, the cardholder's name, the card number, and the expiration date embossed onto the card. The cards also usually included a signature field on the back of the card for the cardholder to provide a signature to protect against forgery and tampering. Thus, the cards served as devices to provide data to merchants and the security associated with the card was the comparison of the cardholder's signature on the card to the cardholder's signature on a receipt along with the embossed cardholder's name on the card.

Due to the popularity of transaction cards, numerous companies, banks, airlines, trade groups, sporting teams, clubs and other organizations have developed their own transaction cards. As such, many companies continually attempt to differentiate their transaction cards and increase market share not only by offering more attractive financing rates and low initiation fees, but also by offering unique, aesthetically pleasing features on the transaction cards. As such, many transaction cards include not only demographic and account information, but the transaction cards also include graphic images, designs, photographs and security features. A recent security feature is the incorporation of a diffraction grating, or holographic image, into the transaction card which appears to be three-dimensional. Holographic images restrict the ability to fraudulently copy or reproduce transaction cards because of the need for extremely complex systems and apparatus for producing holograms.

Administrative and security issues, such as charges, credits, merchant settlement, fraud, reimbursements, etc., have increased due to the increasing use of transaction cards. Thus, the transaction card industry started to develop more sophisticated transaction cards which allowed the electronic reading, transmission, and authorization of transaction card data for a variety of industries. For example, magnetic stripe cards, optical cards, smart cards, calling cards, and supersmart cards have been developed to meet the market demand for expanded features, functionality, and security. In addition to the visual data, the incorporation of a magnetic stripe on the back of a transaction card allows digitized data to be stored in machine readable form. As such, magnetic stripe readers are used in conjunction with magnetic stripe cards to communicate purchase data received from a cash register device on-line to a host computer along with the transmission of data stored in the magnetic stripe, such as account information and expiration date.

Due to the susceptibility of the magnetic stripe to tampering, the lack of confidentiality of the information within the magnetic stripe and the problems associated with the transmission of data to a host computer, integrated circuits were developed which may be incorporated into transaction cards. These integrated circuit (IC) cards, known as smart cards, proved to be very reliable in a variety of industries due to their advanced security and flexibility for future applications. However, even integrated circuit cards are susceptible to counterfeiting.

As magnetic stripe cards and smart cards developed, the market demanded international standards for the cards. The card's physical dimensions, features and embossing area were standardized under the International Standards Organization ("ISO"), ISO 7810 and ISO 7811. The issuer's identification, the location of particular compounds, coding requirements, and recording techniques were standardized in ISO 7812 and ISO 7813, while chip card standards were established in ISO 7813. For example, ISO 7811 defines the standards for the magnetic stripe which is a 0.5 inch stripe located either in the front or rear surface of the card and which is divided into three longitudinally parallel tracks. The first and second tracks hold read-only information with room for 79 alphanumeric characters and 40 numeric characters, respectively. The third track is reserved for financial transactions and includes enciphered versions of the user's personal identification number, country code, currency units, amount authorized per cycle, subsidiary accounts, and restrictions.

More information regarding the features and specifications of transaction cards can be found in, for example, *Smart Cards* by Jose Luis Zoreda and Jose Manuel Oton, 1994; *Smart Card Handbook* by W. Rankl and W. Effing, 1997, and the various ISO standards for transaction cards available from ANSI (American National Standards Institute), 11 West 42nd Street, New York, N.Y. 10036.

The incorporation of machine-readable components onto transactions cards encouraged the proliferation of devices to simplify transactions by automatically reading from and/or writing onto transaction cards. Such devices include, for example, bar code scanners, magnetic stripe readers, point of sale terminals (POS), automated teller machines (ATM) and card-key devices. With respect to ATMs, the total number of ATM devices shipped in 1999 was 179,274 (based on Nilson Reports data) including the ATMs shipped by the top ATM manufacturers, namely NCR (138-18 231st Street, Laurelton, N.Y. 11413), Diebold (5995 Mayfair, North Canton, Ohio 44720-8077), Fujitsu (11085 N. Torrey Pines Road, La Jolla, Calif. 92037), Omron (Japan), OKI (Japan) and Triton.

Typical transaction cards are made from thermoplastic materials, such as polyvinyl chloride (PVC) and polyethylene terephthalate (PET). However, these transaction cards are susceptible to being damaged or destroyed if exposed to damaging environments. For example, transaction cards may be damaged if left exposed to the elements for an extended period of time. Moisture and/or sunlight may break down the chemical bonds within the polymers of typical transaction cards, such that transaction cards left exposed to moisture and sunlight may become warped, cracked and unusable. In addition, thermoplastic transaction cards may be easily bent or may be broken or cut, thereby damaging the transaction card and rendering it unusable.

A need, therefore, exists for a transaction card that has both strength and durability. Moreover, a need exists for a transaction card that withstands exposure to the elements, such as moisture or sunlight. A need further exists for a transaction card that may incorporate the features noted above, such as holograms, signature panels, magnetic stripes, microchips, and the like, such that is has both strength and durability. In addition, a need exists for a transaction card that overcomes the problems noted above.

SUMMARY OF THE INVENTION

The present invention relates to a metal-containing transaction card and a method of making the same. The transaction card may have a magnetic stripe, an embedded microchip, a signature panel, a holographic image, or any other feature typically contained on or within the transaction card. The transaction card of the present invention may have at least one layer of metal. The transaction card of the present invention may have at least one layer of titanium or stainless steel.

A transaction card and a method of making the same are provided whereby the transaction card may have at least one layer of metal. The at least one layer of metal may provide durability and strength to the transaction card. The one layer of metal may be any metal able to be utilized as a transaction card or incorporated into or within a transaction card. The at least one layer of metal may be titanium, stainless steel or aluminum.

Further, a transaction card having at least one layer of metal is provided whereby the transaction card may be of a standard size, i.e., compliant with the International Standards Organization (ISO) for transaction cards.

In addition, a transaction card having at least one layer of metal may further have other layers that include one or more polymeric materials or other metal material, such as aluminum and the like.

Still further, a metal-containing transaction card is provided having features typically contained on or in transaction cards, such as magnetic stripes, embedded microchips, signature panels, holographic images, and the like. Moreover, the metal-containing transaction card may be printed with indicia, such as via screen-printing or a laser-etching process to uniquely identify the transaction card and/or the issuer of the transaction card or any other information.

Additional features and advantages of the present invention are described in, and will be apparent from, the detailed description of the presently preferred embodiments and from the drawings.

BRIEF DESCRIPTION OF THE DRAWINGS

FIG. 15 illustrates a method of making a metal transaction card;

FIG. 16 illustrates a method of making a metal transaction card including personalization of a metal transaction card.

DETAILED DESCRIPTION

The detailed description of exemplary embodiments herein makes reference to the accompanying drawings, which show exemplary embodiments by way of illustration and its best mode. While these exemplary embodiments are described in sufficient detail to enable those skilled in the art to practice the invention, it should be understood that other embodiments may be realized and that logical, procedural and mechanical changes may be made without departing from the spirit and scope of the invention. Thus, the detailed description herein is presented for purposes of illustration only and not of limitation. For example, the steps recited in any of the method or process descriptions may be executed in any order and are not necessarily limited to the order presented. Moreover, many of the functions or steps may be outsourced to or performed by one or more third parties. Furthermore, any reference to singular includes plural embodiments, and any reference to more than one component or step may include a singular embodiment or step. Also, any reference to attached, fixed, connected or the like may include permanent, removable, temporary, partial, full and/or any other possible attachment option. Additionally, any reference to without contact (or similar phrases) may also include reduced contact or minimal contact.

Metal-containing transaction cards and methods of making the same are provided. The transaction cards may be standard-sized (i.e., about 3⅜ inches by about 2¼ inches) or any other size yet still usable as a transaction card. Moreover, the transaction card may have a magnetic stripe, an embedded microchip, a signature panel, a holographic image, or any other feature typically contained on or within a transaction card. The transaction cards may have at least one layer of metal, including titanium or stainless steel.

Figure 1A:
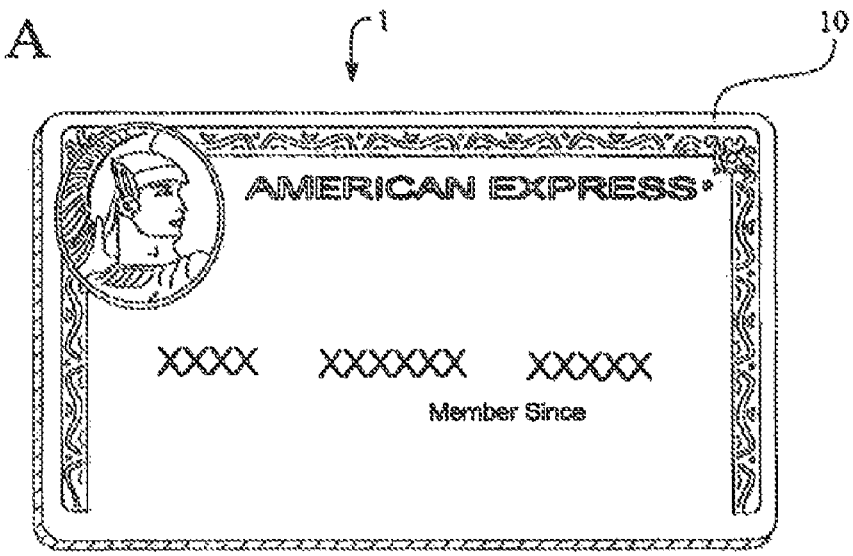
FIG. 1A illustrates a plan view of a front face of a metal-containing transaction card.

Referring now to the drawings, wherein like numerals refer to like parts, FIG. 1 illustrates a plan view of a metal-containing transaction card 1 having a front face 10. The transaction card 1 may be composed of at least one layer of metal that has been flattened into a card shape. Typically metal can be rolled into a sheet. The sheet can then be cut to form individual transaction cards.

Any metal may be utilized as the layer or layers of the transaction cards described herein. Specifically, the metals may include titanium, stainless steel, or aluminum, although any other metal is contemplated by the present invention. The transaction card of the present invention may comprise titanium.

On the front surface 10 of the transaction card 1 may be indicia, such as images, graphics, words, or other symbols, that may be printed on the front surface 10 using conventional printing techniques. Alternatively, the indicia may be laser-etched. A typical laser-etching device for laser-etching metal, such as titanium or stainless steel, is done by a laser from Virtek Vision International, Inc. Lasers can provide marking of metals such as titanium, stainless steel or aluminum of depths of up to 0.100 inches and as low as about 0.003 inches. A pattern may be laser marked onto the front face 10 (or the rear surface 20, as described below and illustrated by FIG. 1B).

In addition, the laser-etching of the metal layer, typically titanium, may provide the transaction card 1 with a plurality of colors on one or both of the faces of the card 1, Specifically, the energy utilized to laser-etch the metal may allow the metal to recrystallize in such a way as to be viewable by an individual as being of a specific color or colors.

In an alternative embodiment, one or both surfaces of the transaction card 1 may be anodized using conventional anodizing methods, thereby providing one or both surfaces of the transaction card 1 that may sealed with an oxide layer thereby protecting the metal and allowing the surface to be receptive to printing inks or coatings. In addition, the anodizing process may provide a color to one or both surfaces of the transaction card 1. For example, the anodizing process may comprise treatment of the surface of the metal with an ionic solution under an electrical current, which can provide one or both faces of the transaction card 1 with a color depending on the voltage of the electricity that is used to anodize the one or both faces of the transaction card 1.

A coating may be applied to one or both faces of the transaction card 1. The coating may be a silane compound thereby providing the metal in the transaction card 1 resistance to scratches, damage, fingerprints, and the like. In addition, a dye or ink may be incorporated into the silane coating thereby providing the transaction card 1 with a particular color. Typically, the silane and the dye are provided across one or both surfaces of the transaction card 1. The silane coating may be incorporated with a black dye whereby one or both surface of the transaction card 1 will have a black appearance. Of course, any other colored coating may be applied to the surface of one or both faces of the transaction card 1 after one or both surfaces of the transaction card 1 are anodized, such as acrylic or polyethylene terephthalate. In addition, the surface coating may be comprised of a thermoset polymeric material, applied to one or both surfaces of the transaction card. The thermoset material may be applied to the transaction card 1 by coating one or both surfaces of the transaction card 1 with dry powder of the thermoset material, and baking the thermoset material to melt the same and set the material on the surface of the transaction card 1. Of course, the transaction card 1 may be provided with no colored coating, thereby providing a metal-colored transaction card, whereby the natural color of the metal may be viewable.

Figure 1B:
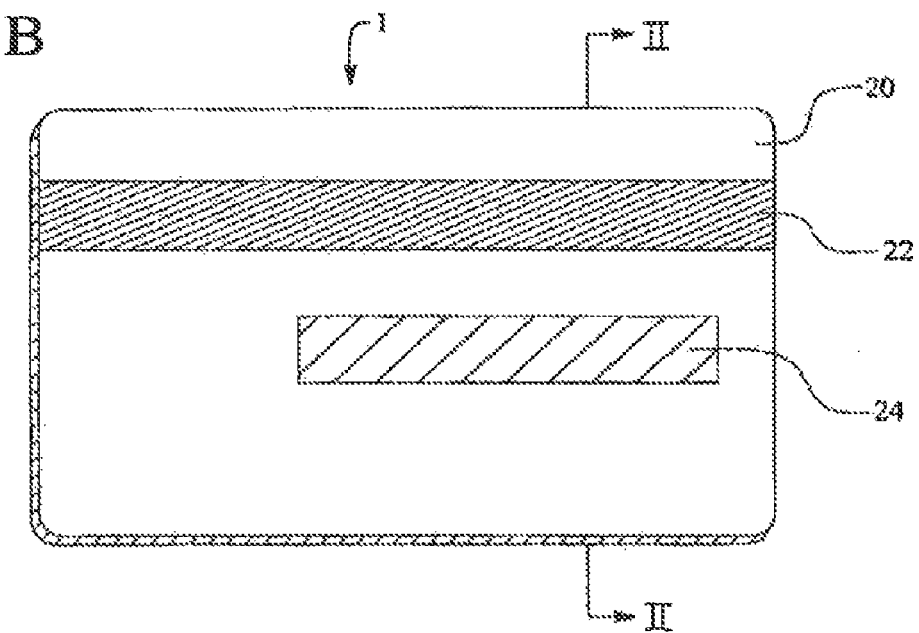
FIG. 1B illustrates a plan view of a back face of a metal-containing transaction card.

FIG. 1B illustrates a rear surface 20 of the transaction card 1 of the present invention. Provided on the rear surface 20 may be a magnetic stripe 22 that may be applied to the rear surface 20 using conventional methods, such as by stamping the magnetic stripe to the transaction card 1. Moreover, a signature panel 24 may be provided as well and may also be stamped to the transaction card 1 or applied via any other conventional method. The signature panel allows the owner of the transaction card to place his or her signature on the transaction card, thereby providing a security feature. In addition, a microchip may be embedded into the transaction card of the present invention. Of course, any other feature may be included on the front surface 10 or the rear surface 20 of the transaction card 1 as may be apparent to one having ordinary skill in the art.

Figure 2A:
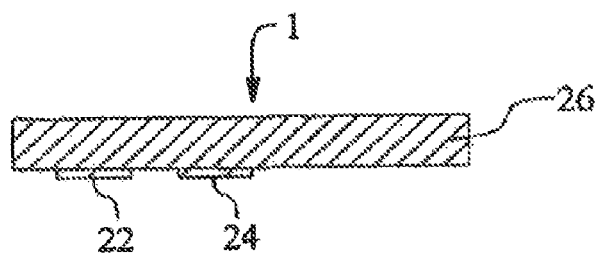
FIG. 2A illustrates a cross-sectional view of a metal-containing transaction card along line II-II of FIG. 1B.

FIG. 2A illustrates a cross-sectional side view of the transaction card 1 along lines II-II of FIG. 1B. As illustrated, the transaction card 1 includes at least a first layer 26 of metal. Of course, the transaction card 1 may comprise two or more layers of metal that are adhered together via heat, pressure, and/or adhesive. The transaction card 1 may include at least one layer of titanium or stainless steel. The first layer 26 further includes the magnetic stripe 22 and the signature panel 24 adhered directly to the first layer 26 of metal. The total thickness of the first layer 26 may be about 30 mils, although other thicknesses of the first layer 26 are contemplated by the present invention. The layers illustrated in FIGS.

2A-2E are exaggerated in thickness to clearly illustrate the structures of the transaction cards described herein.

The transaction card 1 may be stamped, embossed or etched to provide texture, images, alphanumeric characters, or the like. As described above, the front or rear surfaces of the transaction card 1 may be printed or laser-etched to provide indicia, such as graphics, images, text, or any other indicia. In addition, the surface of the first layer 26 may be anodized and/or coated with a coating to protect the surfaces of the metal and/or to provide the surface with a color. Moreover, an adhesive (not shown) may be provided for adhering the magnetic stripe 22 and the signature panel 24 to the metal of the first layer 26. Further, a microchip (not shown) may be embedded into the first layer 26 of metal to provide smart card capabilities to the transaction card made therefrom.

Figure 2B:
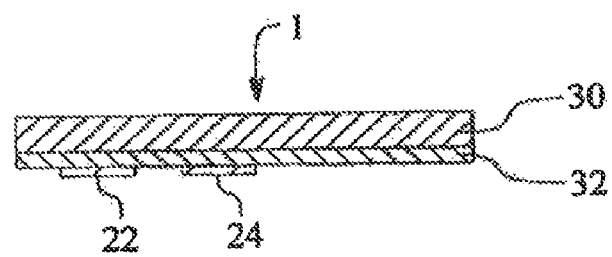
FIG. 2B illustrates a cross-sectional view of an alternate embodiment of a transaction card along line II-II of FIG. 1B.

FIG. 2B illustrates an alternate embodiment of the present invention of a cross-sectional view of the transaction card 1 along line II-II of FIG. 1B. As illustrated, the transaction card 1 includes a metal layer 30, and an optional adhesive layer 32 to adhesively secure the magnetic strip 22 and signature panel 24 to the metal layer 30. The adhesive layer 32 may be laminated, coated, or otherwise applied to the metal layer 30. The total thickness of the transaction card 1 including the metal layer 30 and the adhesive layer 32, as illustrated in FIG. 2B, may be about 30 mils, although other thicknesses are contemplated in the present invention. The metal layer 30 may be made of titanium or stainless steel.

Alternatively, the transaction card does not include an adhesive layer, as illustrated in FIG. 2A, and the magnetic stripe 22 and/or signature panel 24, as well as any other feature, is applied directly to one or both surfaces of the metal layer 30. Alternatively, the transaction card 1 may have an adhesive layer (not shown) provided on the front face 10 of the transaction card 1 for adhering inks or other printing to the metal layer 30.

The transaction card of FIG. 2B may be stamped, embossed or etched to provide texture, images, graphics, alphanumeric characters or the like to the transaction card. As described above, the front or rear surfaces of the transaction card may be printed or laser etched to provide indicia, such as graphics, images, text, or any other indicia.

Figure 2C:
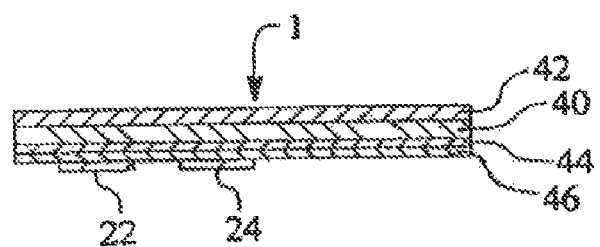
FIG. 2C illustrates a cross-sectional view of another alternate embodiment of a transaction card along line II-II of FIG. 1B.

FIG. 2C illustrates an alternate embodiment of the present invention of a cross-sectional view of a transaction card taken along line II-II of FIG. 1B. In the embodiment illustrated in FIG. 2C, the transaction card 1 comprises a core layer 40 of a substrate, such as a thermoplastic material of for example, PVC, PET copolymer, or other substrate. Further, the core layer 40 has a layer of metal laminated to one or both sides of the core layer 40. In FIG. 2C, the core layer 40 has a first metal layer 42 laminated or otherwise disposed adjacent to a first surface of the core layer 40 and a second metal layer 44 laminated or otherwise disposed adjacent to a second surface of the core layer 40. The core layer 40 may be about 18 mils, while each metal layer 42, 44 may be about 6 mils to provide a transaction card that is about 30 mils in total thickness. However, the core layer 40 and metal layers 42, 44 may be any thickness. The metal layers 42, 44 may be titanium or stainless steel.

Provided on the second metal layer 44 may be an adhesive 46 laminated or otherwise applied thereto for providing adhesion for the magnetic stripe 22, signature panel 24, or other feature typically included on a transaction card. Alternatively, an adhesive layer (not shown) is provided on the first metal layer 42 for providing adhesion to inks for printing purposes, or for any other reason. Alternatively, there is no adhesive layer between the magnetic stripe 22, signature panel 24, or other feature typically included on the transaction card and the first and/or second metal layers 42, 44.

In addition, the transaction card of FIG. 2C may be stamped, embossed or etched to provide texture, images, graphics, alphanumeric characters or the like to the transaction card. As described above, the front or rear surfaces of the transaction card may be printed or laser-etched to provide indicia, such as graphics, images, text, or any other indicia.

Figure 2D:
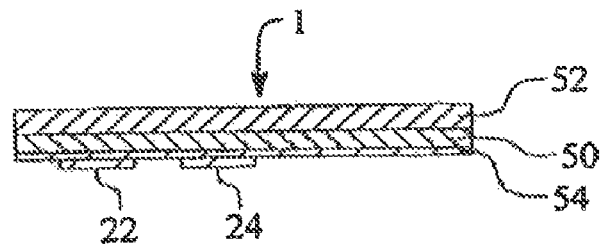
FIG. 2D illustrates a cross-sectional view of a still further alternate embodiment of a transaction card along line II-II of FIG. 1B.

FIG. 2D illustrates a fourth embodiment of the present invention, whereby the transaction card 1, illustrated in a cross-sectional view in FIG. 2D, comprises a first layer 50 of a substrate, such as a thermoplastic material of for example, PVC or PET copolymer, and a second layer 52 of metal laminated or otherwise disposed adjacent to the first layer 50. The first layer 50 and the second layer 52 may have thicknesses that sum to about 30 mils. For example, the first layer may be about 18 mils and the second layer (of metal) may be about 12 mils. However, the layers may be any other thicknesses. The second layer 52 of metal may be titanium or stainless steel.

The first layer 50 may further include an adhesive 54 to provide adhesion to the magnetic stripe 22, the signature panel 24, or to any other feature contained on the transaction card 1. Alternatively, no adhesive layer is present.

Figure 2E:
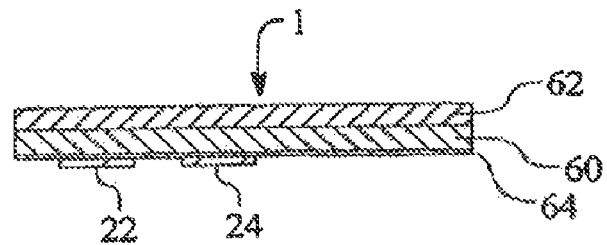
FIG. 2E illustrates a cross-sectional view of another alternate embodiment of a transaction card along line II-II of FIG. 1B.

FIG. 2E illustrates a fifth embodiment of the present invention, whereby the transaction card 1, illustrated in a cross-sectional view in FIG. 2E, comprises a first layer 60 of a metal substrate, such as aluminum, or other metal substrate, and a second layer 62 of a second metal laminated or otherwise disposed adjacent to the first layer 60. The second layer 62 may be titanium or stainless steel, although other metals are contemplated by the present invention. As with the transaction cards described above, the first layer 60 may have an adhesive layer 64 laminated or otherwise applied thereto for providing adhesion to the magnetic stripe 22 and/or the signature panel 24. As with the other embodiment described above, the adhesive may be provided on the second layer as well for providing adhesion to inks for printing, or for other features typically contained on a transaction card. Alternatively, no adhesive layer is present and the magnetic stripe 22 and/or the signature panel 24 are adhered directly to the metal substrate 60.

The following embodiments described herein and illustrated in FIGS. 3-12 relate specifically to transaction cards made from titanium. However, it should be noted that the present invention should not be limited as described, but should also include embodiments whereby other metals, blends and alloys are utilized.

Figure 3:
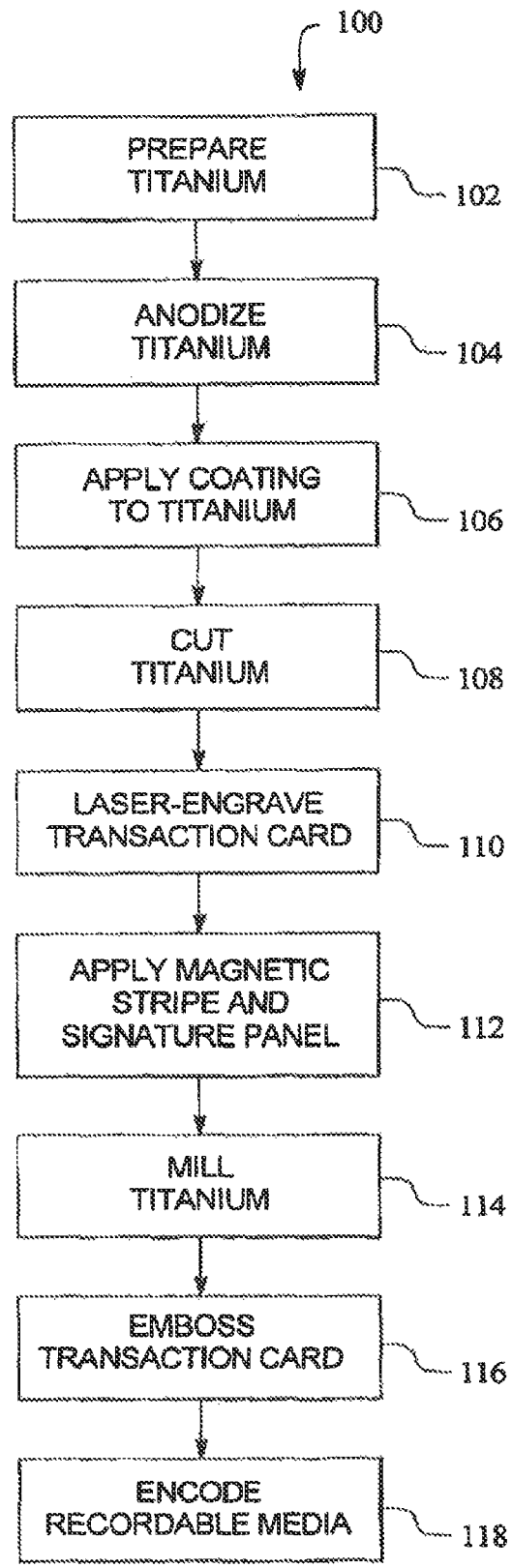
FIG. 3 illustrates a flow chart showing a method of making metal-containing transaction cards.

FIG. 3 illustrates a method 100 of making a metal-containing transaction card of the present invention, wherein the metal is titanium. Specifically, the method 100 includes a first step 102 of preparing the titanium to form into transaction cards. Specifically a sheet of titanium may be prepared that is about 30 mils thick. Typically, the titanium metal is rolled and flattened to the required thickness. The titanium sheet may comprise titanium metal that has little to no magnetic properties, so that the titanium does not interfere with the magnetic stripe and/or microchip that may be embedded within the transaction card.

In an anodizing step 104, the titanium sheet is anodized using a conventional anodizing process. Specifically, the titanium may be disposed in a bath having ions and an electrical current therein to anodize one or both of the faces of the sheet of titanium. As noted above, anodizing the sheet of titanium can provide one or bath faces of the sheet of titanium with a colored surface, depending on the current that is supplied during the anodizing process, as is apparent to one having ordinary skill in the art. Moreover, anodizing oxidizes the surface of the titanium, thereby sealing and protecting the titanium.

In a coating step 106, a coating is applied to one or both faces of the sheet of titanium to provide one or both faces of the sheet with a color and to further protect the titanium. Specifically, the coating may be a silane coating having a dye contained therein, wherein the silane is coated as a layer on one or both faces of the transaction card. The silane coating may be applied in a waterless solvent or a water-based system. In addition, other materials that may be coated to one or both faces of the transaction card are polyethylene terephthalate and acrylic, although any other coating may be utilized to provide a coating to protect the titanium and, optionally, to provide a color to the one or both faces of the transaction card. For example, the coating may be made from a thermoset material that may be sprayed onto the one or both surfaces of the transaction card in powder form. The transaction card may then be baked, and the powder may melt to the surface of the transaction card.

Step 108 illustrates a cutting step whereby the sheet of titanium, which may have been anodized and/or coated as described above, may be cut into individual transaction card shapes. Common methods of cutting titanium include, but are not limited to, water jet cutting, die cutting, laser cutting or plasma cutting. The goal in cutting the titanium is to easily and efficiently cut the titanium sheet into transaction card shapes while avoiding sharp edges.

After cutting the titanium sheet via step 108, the individual transaction cards may be laser-engraved via a laser-engraving step 110. The laser engraving may be done via commonly known laser engraving techniques to provide a pattern in one or both faces of the transaction card. Moreover, the laser engraving may cut away a coating that may be disposed on the one or both faces of the transaction card, thereby providing a visible pattern. For example, if a black coating is applied to the titanium sheet via step 106, the laser beam may etch a pattern in the black coating to give a pattern that is not black, but may be metal colored, or colored in any other way. In addition, the laser beam may melt the surface of one or both faces of the transaction card, which may cause the titanium to recrystallize when cooled. The recrystallization may produce a variety of colors in the surface of one or both faces of the transaction card. The laser engraving step 110 may be accomplished via a laser, such as, for example, a YAG laser having a wavelength of about 1064 nanometers. Of course, any other laser may be utilized that provides a pattern, a texture or a color to the titanium as may be apparent to one having ordinary skill in the art.

After laser engraving the transaction card, a magnetic stripe and signature panel of the transaction card may be applied to the transaction card via step 112. Typically, the magnetic stripe and the signature panel are stamped using techniques common in the art of making transaction cards. Specifically, the magnetic stripe and signature panel are applied to one or both of the surfaces of the transaction card with the use of an adhesive that may be applied on one or both surfaces of the transaction card. The adhesive may be screen-printed to one or both surfaces of the transaction card, although any other method of applying the adhesive is contemplated by the present invention. Most materials require the use of an adhesive to adhere to one or both surfaces of the transaction card. However, certain coatings may allow the magnetic stripe and the signature panel to be applied without the use of adhesives. For example, a coating of thermoplastic, such as a flat black vinyl thermoplastic, may be coated onto the card and may allow the magnetic stripe and the signature panel to be applied to the transaction card without adhesive. The stamping process may melt the thermoplastic material, thereby allowing the thermoplastic material to adhere the magnetic stripe and/or the signature panel when cooled and solidified.

After the magnetic stripe and the signature panel have been applied to the transaction card, the transaction card may be milled via step 114 to provide a space to apply an embedded microchip for a smart card. The milling process may be done in a similar manner to conventional plastic transaction cards, but may be accomplished with a boron nitride or boron carbide tipped machine or other machine able to mill titanium. In addition, the transaction card may be milled via a cryo-milling process, in which the mill head is cooled with a stream of liquid nitrogen to ensure that the transaction card and/or the mill head does not overheat. Typically, the transaction card may have an area about 20 to about 25 mils deep milled from the transaction card to provide a space for a microchip. The microchip may be applied to the milled area of the transaction card, and may stay within the milled area due to an adhesive that may be disposed therein.

After milling the transaction card to embed the microchip therein, the transaction card may be embossed via an embossing step 116. Specifically, the embossing may be done by subjecting the transaction card to a high pressure die that may punch a character or a plurality of characters into the surface of the transaction card. The embossing may be done to provide information on the surface of the transaction card that may be readable by an individual or a machine. Specifically, an account number or other unique identifier is typically embossed on a transaction card. The embossing step 116 may be accomplished with an addressograph machine. Of course, other methods of embossing the transaction card are contemplated, and the invention should not be limited as herein described.

Finally, the transaction card may be encoded via step 118 via any encoding steps commonly used to encode the transaction cards. Specifically, either or both of the recordable media, such as the magnetic stripe and/or the microchip, may be encoded to provide the transaction card having information contained therein. The recordable media may be read via a magnetic stripe reader or a microchip reader, as may be apparent to one having ordinary skill in the art.

Figure 4:
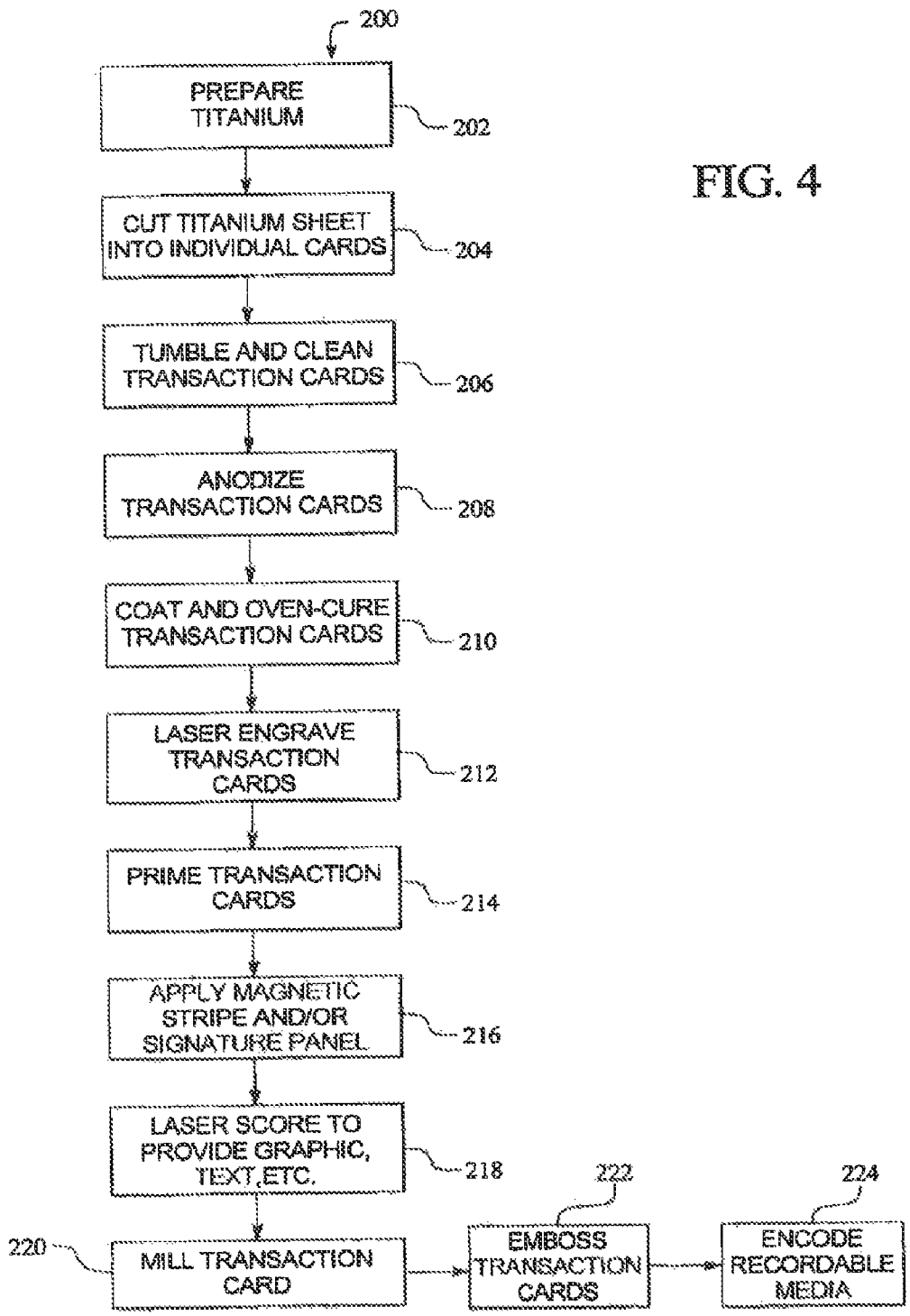
FIG. 4 illustrates a flow chart showing an alternate method of making titanium transaction cards.

FIG. 4 illustrates an alternate method 200 of making transaction cards comprising titanium. The method 200 comprises a first step 202 of preparing the titanium by rolling and flattening the titanium into a sheet to form into transaction cards. The first step 202 may be substantially similar to the first step 102 described above with respect to FIG. 3.

After the titanium sheet is prepared via step 202, the titanium sheet may be cut in a cutting step 204, whereby the sheet of titanium may be cut into individual transaction card shapes. For example, the titanium sheet may be cut via the methods described above with respect to step 108 of FIG. 3.

Once the individual transaction cards have been cut from the titanium sheet, each individual transaction card may be tumbled and cleaned to smooth any sharp edges via a tumbling and cleaning step 206. It is important to ensure that all of the edges are smooth.

After the transaction cards have been smoothed and cleaned, each transaction card may be anodized and primed via an anodizing step 208. The anodizing step may be substantially similar to the anodizing step 104 as described above with reference to FIG. 3.

After being anodized and primed, each transaction card may be coated and oven cured via a coating step 210. The coating step 210 may be substantially similar to the coating step 106 as described above with reference to FIG. 3. Each side of each transaction card may be coated and oven-cured separately in a multi-step process.

After each side of each transaction card is coated and oven-cured, each transaction card may be laser engraved via laser engraving step 212, which may be substantially similar to the laser-engraving step 110, as described above with reference to FIG. 3.

Once each transaction card is laser engraved, a primer may be applied to one or both of the surfaces by screen printing the primer via a priming step 214. The primer may be applied across the entire surface of each transaction card, or may be applied precisely where the magnetic stripe and/or signature panels are desired.

After each transaction card is primed, the magnetic stripe and/or signature panels may be applied via step 216. The magnetic stripe and/or signature panel may be applied in a substantially similar way as described in step 112, described above with respect to FIG. 3.

After the magnetic stripe and/or signature panels have been applied, each of the surfaces of each transaction card may be laser scored via step 218 to provide graphics, text and numerals to either or both of the surfaces of each transaction card.

Once each transaction card has been laser scored to provide graphics, text, numerals and/or other indicia, a microchip may be disposed within the transaction card via step 220. For example, the transaction card may be milled to provide a space in the transaction card for an embedded microchip. The disposing of the microchip into the transaction card via step 220 may be done in a substantially similar manner as step 114, described above with reference to FIG. 3.

Each transaction card may then be embossed via an embossing step 222, which may be substantially similar to the embossing step 118, as described above with reference to FIG. 3. Finally, each transaction card's recordable media, such as the magnetic stripe and/or the embedded microchip, may be encoded via an encoding step 224.

Figure 5:
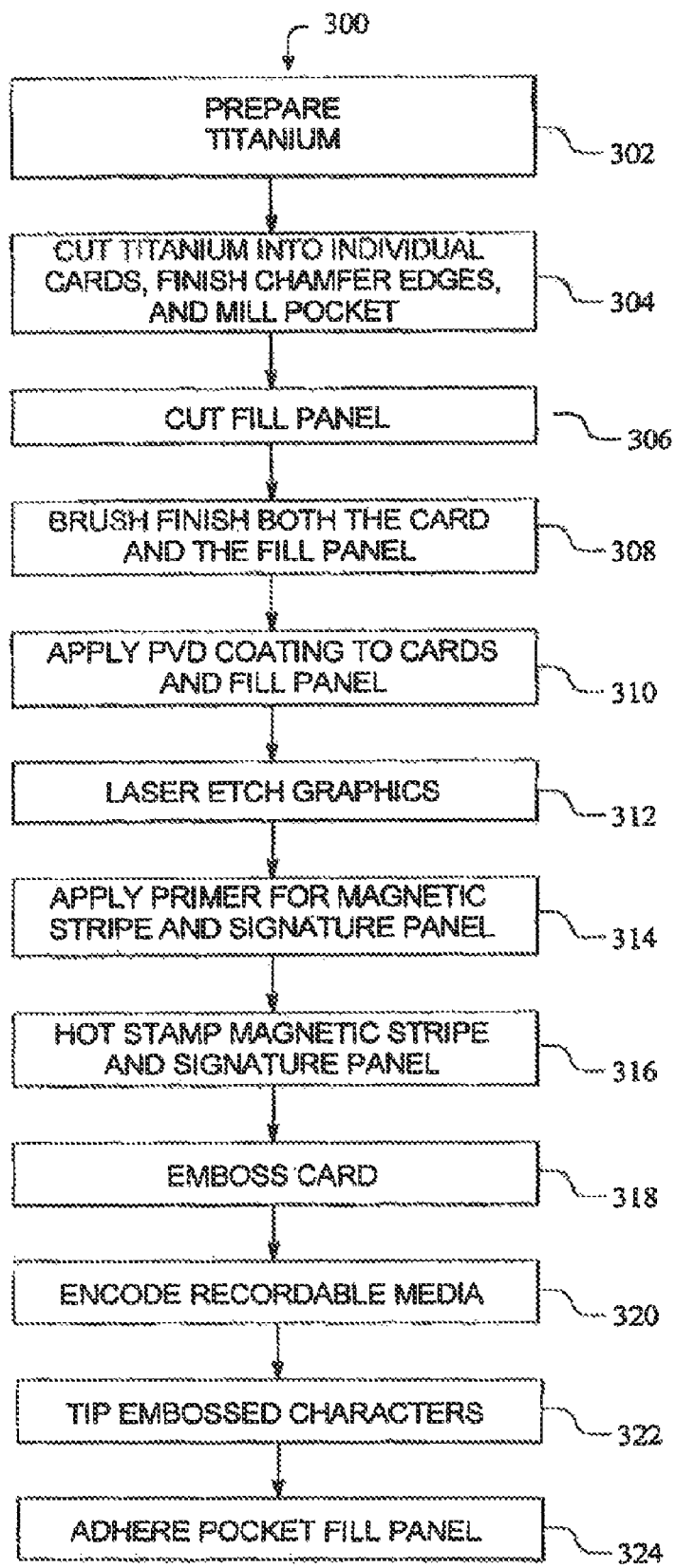
FIG. 5 illustrates another flow chart showing an alternate method of titanium transaction cards.

In an alternate method 300 of making titanium transaction cards illustrated in FIG. 5, sheets of titanium are prepared via step 302. The titanium sheets may be prepared as described above in steps 102, 104 with respect to FIGS. 3, 4, respectively. Specifically sheets of titanium may be prepared that are about 30 mils thick. In addition, other sheets of titanium may be prepared that are about 15 mils thick, that will be cut into inset fill panels, as described below. Typically, the titanium metal is roiled and flattened to the required thickness. The titanium sheets may comprise titanium metal that has little to no magnetic properties, so that the titanium does not interfere with the magnetic stripe and/or a microchip that may be embedded within the transaction card.

The 30 mil thick titanium sheets are then cut into individual cards via step 304. At the same time, the edges of the individual cards may be beveled to create chamfer edges. The chamfer edges may be prepared on both surfaces of each individual card on all four edges of each titanium card. Alternatively, the chamfer edges may be prepared on only one surface of each titanium card, such as on a front surface of each titanium card. In addition, at the same time that the chamfer edges are prepared, a pocket may be milled into each individual card. The pocket may be milled into a backside of each transaction card at the same location on the transaction card where the transaction card is embossed to provide characters on the front surface of each transaction card.

Referring now to FIG. 5, the 15 mil thick titanium sheets may then be cut into individual inset fill panels via step 306. The inset fill panel will fit within the pocket when placed therein with a suitable adhesive. When the inset fill panel is disposed within the pocket with a suitable adhesive, the inset fill panel forms a smooth surface on the backside of the titanium card.

Both the titanium cards and the inset fill panels may then be brushed via step 308 to provide a nice finish on each transaction card. Typically, the brushing is done via known titanium brushing techniques to provide titanium surfaces having a grain running in the same direction. The brushing may also create titanium surfaces on each transaction card having another pattern.

Both surfaces of each titanium card may be coated via step 310 by physical vapor deposition ("PVD") of a coating that may be utilized to both protect the titanium surfaces and provide a distinctive appearance. The coating may be titanium carhonitride, which, when vapor deposited on the surfaces of each titanium card, provides an even and substantially black coating to each surface of each titanium card. One surface of each fill panel may also be coated by physical vapor deposition. Specifically, the surface of the fill panel that is disposed on the outside of the transaction card when the fill panel is adhesively disposed within the pocket should be coated by physical vapor deposition. Other coating techniques may also be utilized to provide the coating on the titanium card as apparent to one having skill in the art.

Graphics may then be laser etched into the titanium card via step 312. Specifically, the laser etching may etch both the coating and the titanium to provide the graphics, as described above.

Primer or adhesive material may be applied to the backside of each titanium card via step 314 to allow the magnetic stripe and/or the signature panel to be hot stamped thereon, via step 316. A primer material that may be utilized is known as "passport transfer material," and may be utilized to allow the magnetic stripe and the signature panel to adhere to the titanium and/or the coating applied by physical vapor deposition, as described above. The signature panel and/or the magnetic stripe may be substantially similar to or identical to typical magnetic stripes and/or signature panels typically utilized in transaction cards.

Each titanium card may then be embossed via step 318. The embossing of the characters may be applied on the surface of the titanium within the pocket, such as with an addressograph machine. The embossing is done within the pocket so that the embossing may be done in titanium that is thinner than the total thickness of the transaction card. It has been found that embossing the characters in thinner titanium is easier, and provides clearer and more visible characters, without distortion or warping of the characters or of the transaction card.

The recordable media that may be contained within each titanium card may then be recorded via step 320. For example, magnetic stripes are typically disposed on a surface of a transaction card. The magnetic stripe disposed on the surface of each titanium card may be encoded via step 320. In addition, if other recordable media are present, such as an embedded microchip, it may be encoded via step 320.

Each embossed character displayed on the front surface of each transaction card may then be "tipped" or sanded or abraded to remove the coating applied by the physical vapor deposition via step 322. This allows each character to obtain a metallic hue that is easily and clearly visible when contrasted with the substantially black coating on the remainder of the transaction card.

The inset fill panel 360 may then be adhered within the pocket 352 via step 324. A suitable adhesive may be utilized that adheres the titanium surface of the inset fill panel 360 with the titanium surface within the pocket 352 or the coating that may be on the surface of within the pocket 352 by physical vapor deposition. A suitable adhesive is known as "die mount adhesive", which is a heat activated film.

Figure 6:
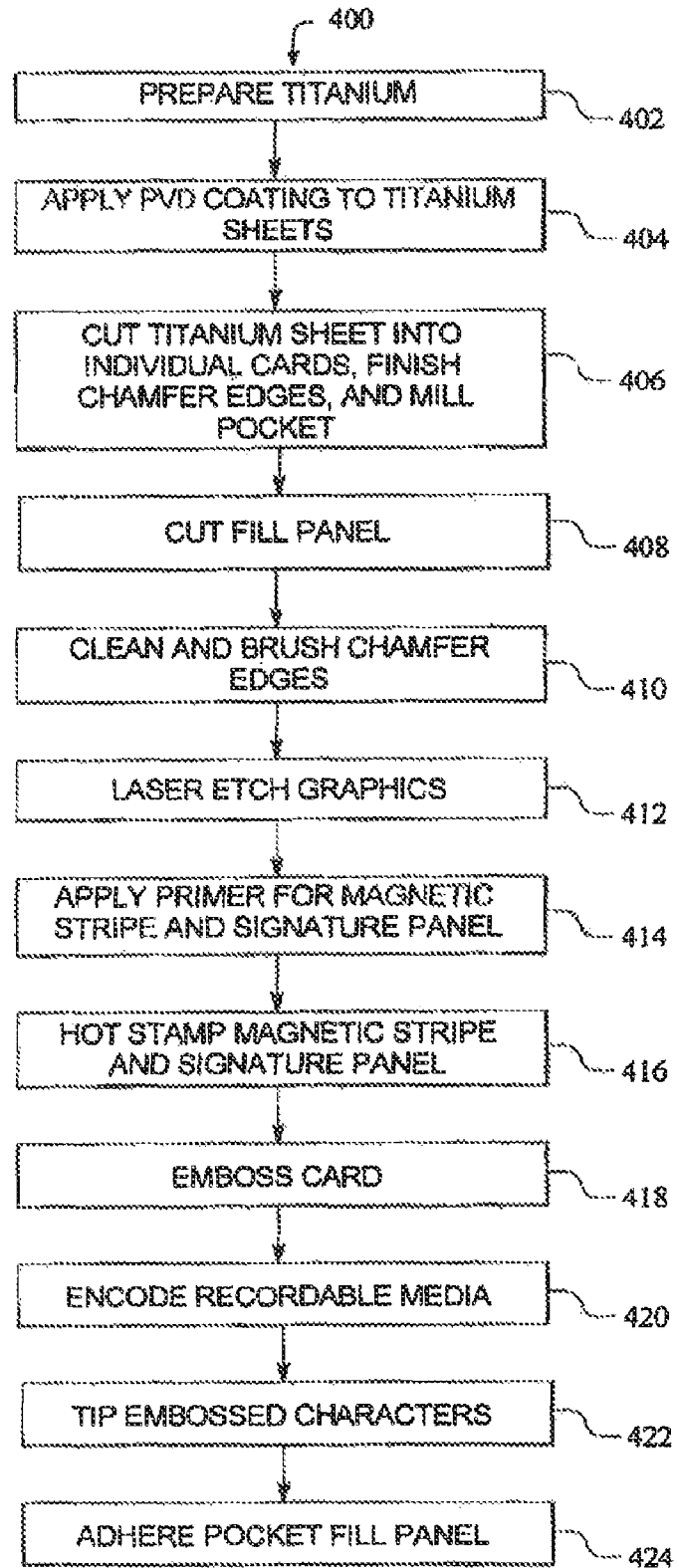
FIG. 6 illustrates art alternate flow chart showing a still further alternate method of making titanium transaction cards.

FIG. 6 illustrates an alternate method 400 of making titanium transaction cards. The method 400 is similar to the method 300, described above with respect to FIG. 5. However, the transaction card made by the method 400 may have a chamfer edge that is bare. In other words, the titanium transaction card may have a coating thereon, such as applied via physical vapor deposition. However, the chamfer edges may have a metallic hue because the coating may be removed at the edges to create a transaction card having a metallic "frame" around each transaction card.

A first step 402 of preparing the titanium sheets may be similar, if not identical, to the step of preparing the sheets via step 302 as described in FIG. 5 above. Step 404 entails applying the coating to the titanium sheets so that the entire titanium sheets are coated prior to cutting the sheets into individual cards and inset fill panels, which is done via step 406. When cutting each titanium sheet into individual titanium cards via step 406, each edge of each transaction card may be beveled to create the chamfer edges without the coating disposed thereon. The pocket may also be milled during step 406.

The fill panels are cut from the 15 mil thick titanium sheets via step 408. When coating the titanium sheets utilized as the fill panels, only one surface of the sheet need be coated via vapor deposition. However, having both surfaces coated by physical vapor deposition does not change the method described herein.

Each chamfer edge may be brushed and cleaned via step 410 to provide smooth edges having metallic grain running in the same direction. Alternatively, the edges may be brushed to provide patterns in the titanium on the edges of the transaction cards.

The titanium cards may then be etched to provide graphics via step 412. Primer may be applied to a surface of the titanium transaction cards for the magnetic stripe and signature panel via step 414. The magnetic stripe and signature panel may be applied via step 416. The card may be embossed via step 418. The recordable media may be encoded via step 420. Each embossed character may be "tipped" via step 422, and the fill panel may be adhered within the pocket via step 424. Each step 412-424 may be substantially similar to or identical to the steps 312-324, as described above with respect to FIG. 5.

Figure 7:
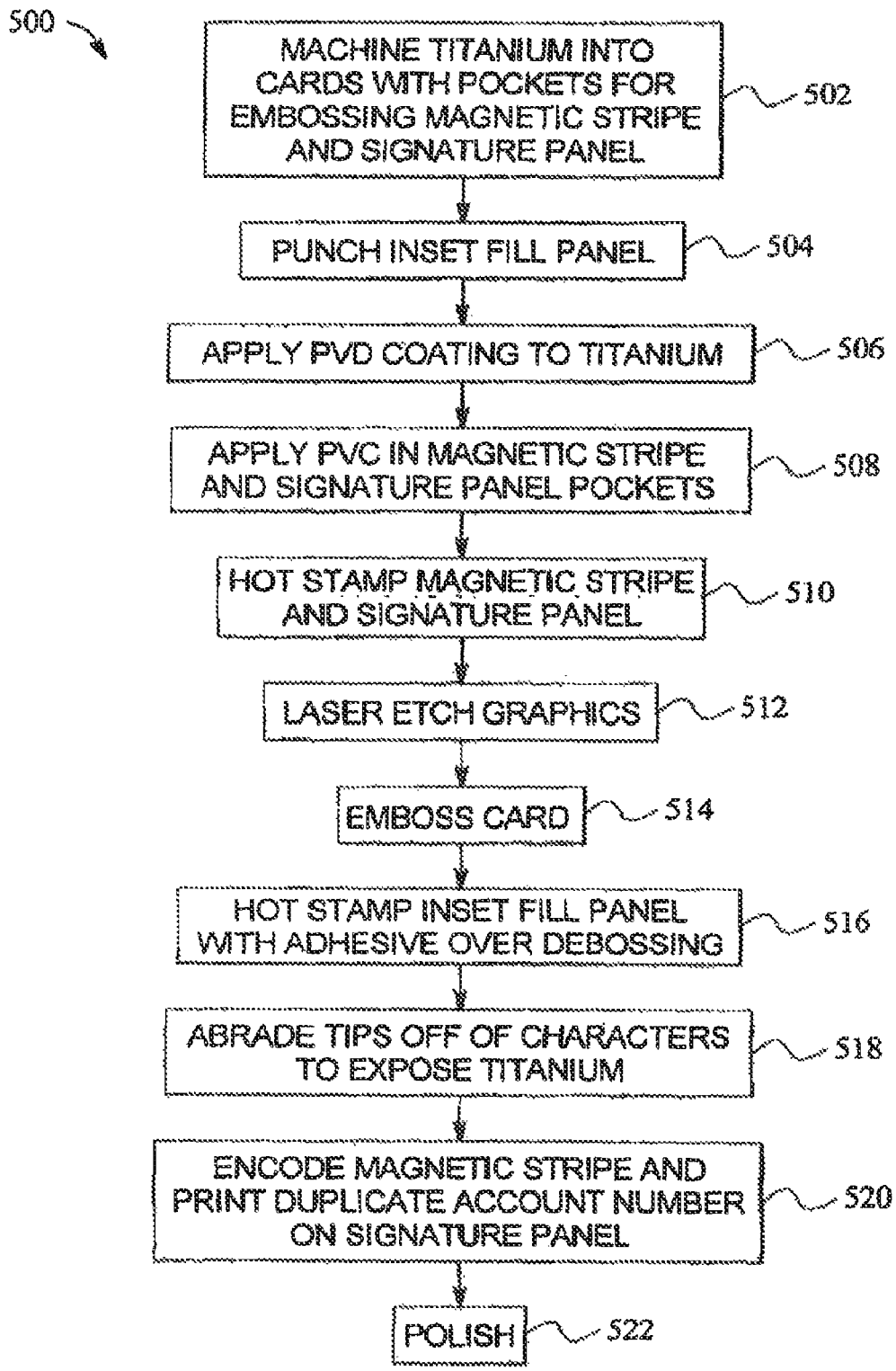
FIG. 7 illustrates a still further alternate flow chart showing an alternate method of making titanium transaction cards with embossed characters, a magnetic stripe and a signature panel.
Figure 8:
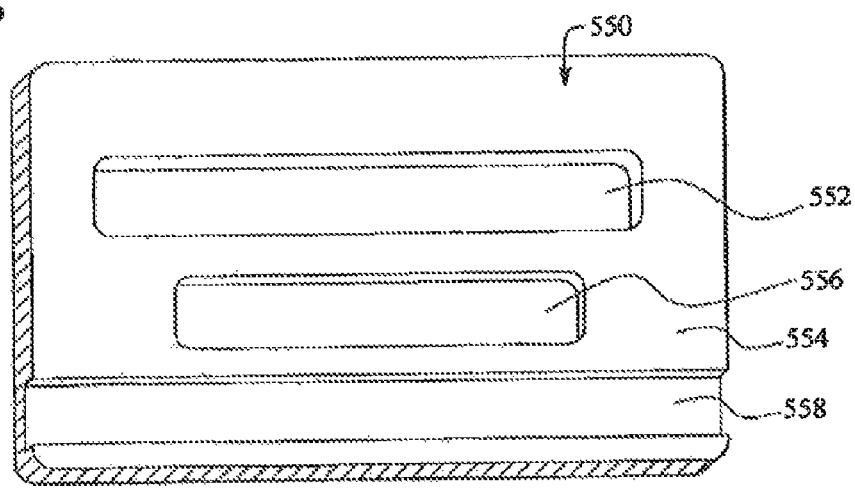
FIG. 8 illustrates a plan view of a titanium card made by the methods of making the titanium transaction cards.
Figure 9:
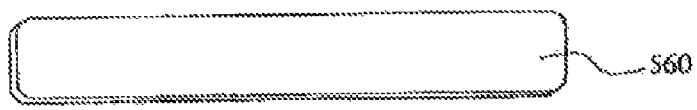
FIG. 9 illustrates a plan view of an inset fill panel made during the methods of making the titanium transaction cards.

FIG. 7 illustrates a still further embodiment of a method of making titanium transaction cards 500. Specifically, the method 500 comprises a first step 502 of machining the titanium into cards with pockets for embossing and application of a magnetic stripe and a signature panel. FIG. 8 illustrates a titanium transaction card 550 comprising an embossing pocket 552 disposed within one or more layers of titanium 554, a signature panel pocket 556 disposed within the titanium 554, and a magnetic stripe pocket 558 disposed within the titanium 554. An inset fill panel 560, as illustrated in FIG. 9, is punched pursuant to step 504.

A PVD coating is applied to one or more surfaces of the titanium transaction card to provide a surface coating, such as a black surface coating, on the one or more surfaces of the titanium transaction cards via step 506. The transaction card 550 may have other types of coatings to provide protection of the titanium or to otherwise protect the titanium.

Figure 10:
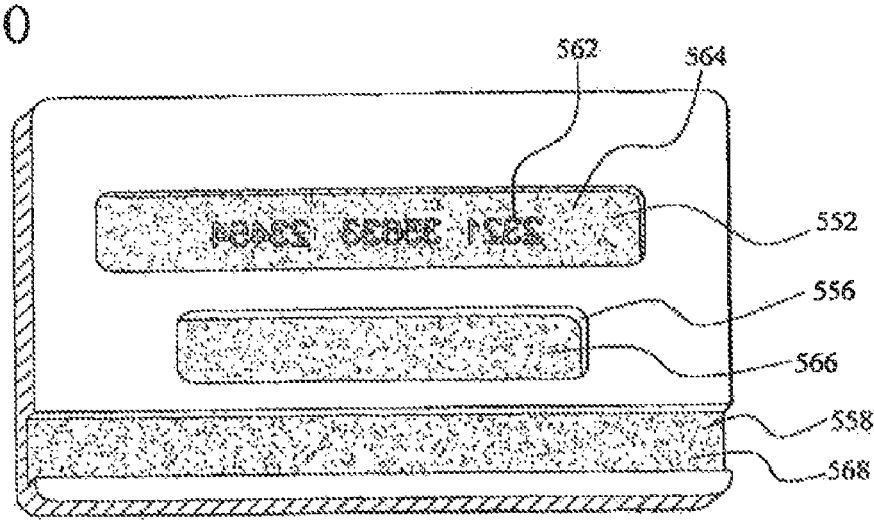
FIG. 10 illustrates a plan view of an embossed titanium card with adhesive disposed in the pockets.

PVC, or other suitable adhesive material, is disposed within the signature panel pocket 556 and/or the magnetic stripe panel 558 via step 508. As illustrated in FIG. 10, the PVC material, or other adhesive material, forms an adhesive layer 566 within the signature panel pocket 556 and an adhesive layer 568 within the magnetic stripe panel 558.

Figure 11:
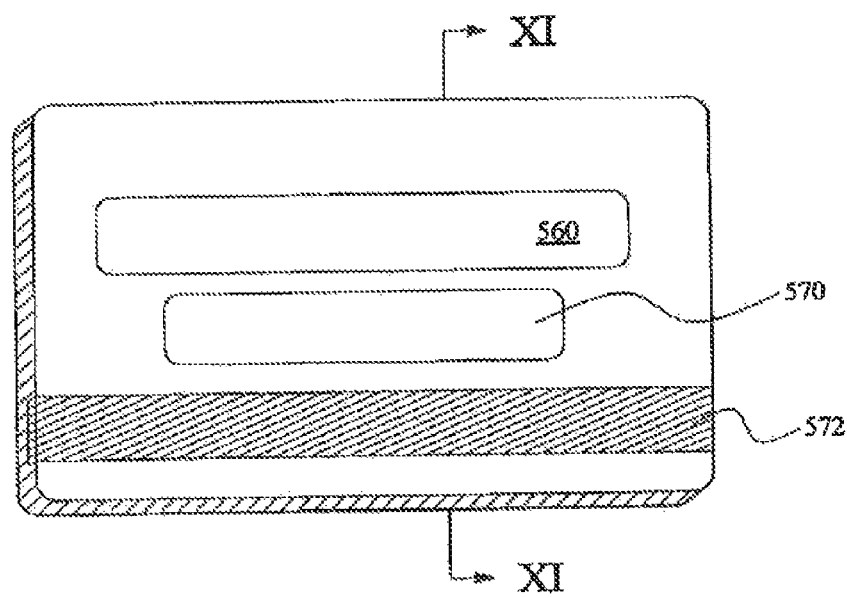
FIG. 11 illustrates a plan view of a titanium card having a fill panel disposed within a pocket and a magnetic stripe and signature panel disposed in the other pockets.

A signature panel and magnetic stripe are hot stamped into the signature panel pocket 556 and magnetic stripe pocket 358 via step 510. The signature panel 570 and magnetic stripe 572, as illustrated in FIG. 11, are applied over the adhesive layer 566 and adhesive layer 568, disposed within the signature panel pocket 556 and magnetic stripe pocket 558, respectively. The adhesive layers 566, 568 provide for adequate adhesion of the signature panel 570 and magnetic stripe 572 to the titanium. The pockets allow the signature panel 570 and magnetic stripe 572 to remain coplanar with the surface of the card.

Graphics are laser etched on the PVD coating of the titanium transaction card 550 via step 512. Characters 562 are then embossed via step 514 within an embossing pocket 552. The relative thinness of the titanium in this area allows embossing to be accomplished easily. Adhesive 564 is then applied within the embossing pocket 552, typically hot-stamped, so that the inset fill panel 560 may be adhered within the embossing pocket 552 via step 516.

The tips of the embossed characters are then abraded via step 518 to expose the titanium. This allows the characters to take on a metallic hue, which stands out against the black PVD coating of the surface of the titanium transaction card.

The magnetic stripe 572 is then encoded, and the transaction card account number may be printed onto the signature panel 570. Finally, the edges and the characters are polished via step 522.

Figure 12:
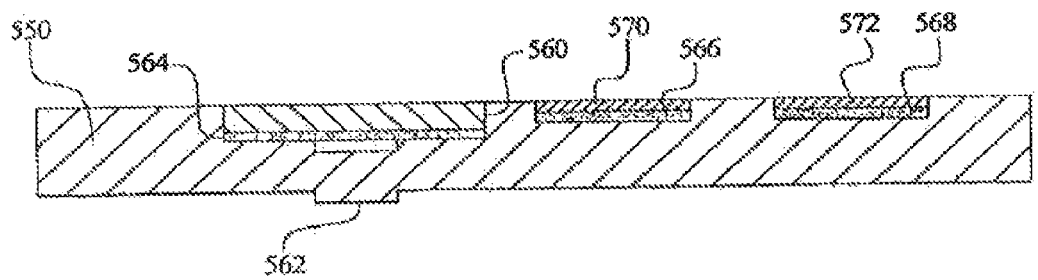
FIG. 12 illustrates a cross-sectional view of the titanium card having the fill panel disposed within the pocket and a magnetic stripe and signature panel disposed in other pockets.
Figure 13A:
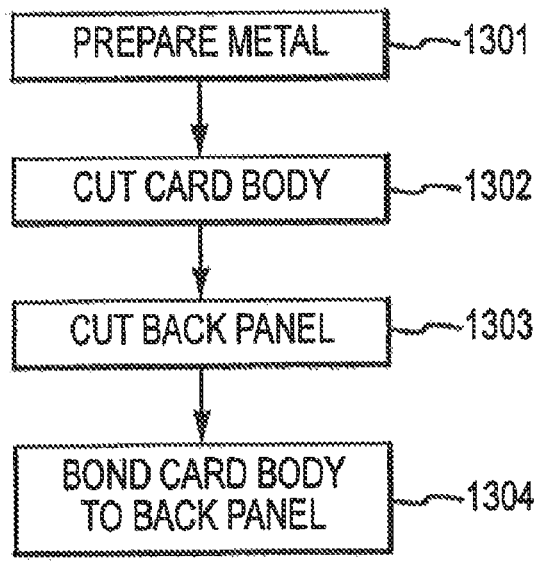
FIGS. 13A and 13B illustrate a method of making a metal transaction card.
Figure 13B:
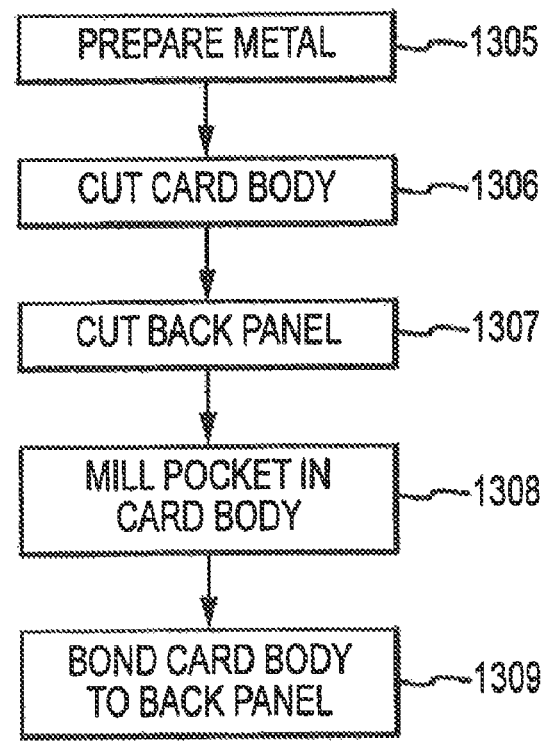

FIG. 12 illustrates a cross-sectional view of the titanium transaction card 550 illustrated in FIG. 11. Specifically, the titanium transaction card 550 includes the inset fill panel 560 disposed over the adhesive 564 within the embossing pocket 552. The characters 562 are embossed through the embossing pocket 552 prior to adherence of the inset fill panel 560. In addition, the signature panel 570 and magnetic stripe 572 are illustrated, adhered to the titanium via adhesive layers 566, 568, respectively. As illustrated, the signature panel 570 and the magnetic stripe 572 are coplanar with the surface of the card.

Although the above embodiment of the present invention, illustrated in FIGS. 8-12, shows only an embossing pocket 352, a signature pocket 356 and a magnetic stripe pocket 358, any other pocket may be milled, cut or otherwise disposed in one or more surfaces of a metal-containing transaction card to provide a location for a transaction card feature. For example, a transaction card feature may include, as noted above, signature panels, magnetic stripes, microchips, holographic images, or any other feature providing information and/or security thereon or therewithin. The present invention should not be limited as herein described with respect to FIGS. 8-12.

In various embodiments, the present invention includes a metal transaction card that may comprise a card body and a back panel. In various embodiments, the present invention includes a method for fabricating a metal transaction card that may comprise a card body, a microchip and a back panel. FIGS. 13A-13B and 14A-14C depict a method of making a metal transaction card and one embodiment of such a metal transaction card.

A card body may comprise any metal or composite. A card body may have the standard transaction card dimensions or may include non-standard dimensions. A card body may further comprise plastic, including PVC, PVB, or polycarbonate. A card body may comprise only a single layer of metal or multiple layers of metal. Metal used to construct the card body, as used herein, may be any metal or metal alloy. For example, titanium, stainless steel, alloys thereof and combinations thereof may be used to construct the card body. A card body may be prepared 1301, 1305 by any method discussed herein. A card body may be cut, punched or shaped 1302, 1306 from a sheet of metal. Any method of cutting metal disclosed herein may be used to cut a first portion from a sheet of metal. As would be appreciated by one skilled in the art, some devices (e.g., hopper) used in the card production process rely on suction to hold and move individual cards through various steps, including embossing steps. A metal containing card body may be incompatible with conventional suction devices as a metal containing card body may not be flexible. In various embodiments, a device that may hold and move metal containing cards may be used.

A card body may include a pocket to receive a back panel. A card body may have a pocket to receive a microchip. A pocket may be milled, drilled, lasered, or otherwise created in the card body. For example, card body 1407 has pocket 1401 milled to accept back panel 1406. Also for example, card body 1407 has pocket 1410 milled to accept microchip 1403. As a further example, card body 1407 has pocket 1402 milled to accept a signature panel. The procedure for creating this pocket via milling is described below with reference to the card making process 1308.

A back panel may be any layer of metal. A back panel may be any layer of plastic. The metal used to construct the back panel may be any metal or metal alloy. For example, titanium, stainless steel, alloys thereof and combinations thereof may be used to construct the back panel. A back panel may be prepared 1301, 1305 by any method discussed herein. A back panel may be cut 1303, 1307 from a sheet of metal. Any method of cutting metal disclosed herein may be used to cut a back panel from a sheet of metal. A back panel may have the standard transaction card dimensions. In one embodiment, the back panel may include one or more dimensions that are smaller than a card body (as further described below).

A card body may have indicia disposed on, within or above a surface. Indicia include legal notices, regulatory compliance messages, phone numbers, URLs, email addresses, trademarks, pictures, graphics, bar codes, or any other readable or understandable symbol. Indicia may be disposed in any manner suitable for the material of the card body. For example, indicia may be printed onto the card body. Printing may be completed with any suitable type of ink that bonds to metal or plastic. Also for example, indicia may be etched onto the card body. Etching may be accomplished by a laser. Etching may be accomplished chemically, or through milling, grinding, pressing, stamping, embossing or scratching. For example, indicia 1404 (also referred to as embossed characters 1404) may be pressed or embossed onto a card body 1407. Also for example, indicia 1408 may be laser etched onto card body 1407. As an additional example, indicia 1409 may be printed onto card body 1407. To facilitate the pressing or embossing of indicia onto a card body, a pocket may be milled on one surface of the card body. Milling may involve the removal of card body material over an area.

After a pocket is created, a pressing, stamping or embossing process may be used to create indicia. The embossing of the characters may be applied on the surface of the titanium within the pocket, such as with an addressograph machine. The pressing, stamping or embossing may be completed within the pocket so that the embossing may be completed in a portion of the titanium or other metal that is thinner than the total thickness of the transaction card. Pressing, stamping or embossing indicia in thinner titanium may be easier, and may provide clearer and more visible characters on the other side of the metal surface, without distortion or warping of the characters or of the card body itself. The indicia made by pressing or embossing may be raised above the surface that is opposite the pocket. Pressing, stamping or embossing metal to create raised indicia may create indicia that are sharp or otherwise inconvenient to use in a transaction card. As such, raised indicia may be further milled, polished, ground, or otherwise reduced in thickness.

A back panel may have indicia disposed on a surface. Indicia include legal notices, regulator) compliance messages, phone numbers, URLs, email addresses, trademarks, pictures, graphics, bar codes, or any other readable or understandable symbol. Indicia may be disposed in any manner suitable for the material of the back panel. For example, indicia may be printed onto the back panel. Printing may be completed with any suitable type of ink that will bond to metal or plastic. Also for example, indicia may be etched onto the back panel. Etching may be accomplished by a laser. Etching may be accomplished chemically, or through milling, grinding, pressing, embossing or scratching. For example, indicia 1405 may be printed on back panel 1406. In many jurisdictions, transaction cards are required to display particular pieces of information. A back panel having indicia disposed thereon is one approach to fulfilling certain requirements for different regions. By disposing indicia on a back panel, one card body may be manufactured and then paired with an appropriate back panel. This reduces production costs while still allowing a transaction card issuer to comply with applicable regulations.

A back panel may be bonded to a card body. Bonding 1304, 1309 may be accomplished by coupling a back panel and a card body and subjecting the combination to suitable temperatures and pressures. Any pressure suitable for bonding may be used. Bonding may occur at any pressure high enough so that bonding would be effective. Bonding may occur at any pressure lower than that which would unacceptably deform either the card body or back panel. Any suitable temperature suitable for bonding may be used. For example, bonding may occur at about 275 degrees F. (135 degrees C.). Further, bonding may occur at any temperature high enough so that bonding would be effective. Bonding may occur at any temperature lower than that which would melt or otherwise unacceptably deform either the card body or back panel. Bonding may take place over any suitable amount of time. Bonding time may be dependent on the temperature and pressure used. For example, bonding may occur over the course of 15 seconds. Bonding may be performed with no adhesive. Bonding may be performed with an adhesive disposed between the card body and the back panel. Many adhesives are known in the art that are suitable for such a process. For example ABLEBOND 931-1T1N1 may be used.

A card body may have a microchip disposed thereon. The position of the microchip on the card may be standardized by industry practice (for example, ISO 7816). Many jurisdictions may now require a microchip in transaction cards. The high temperatures and pressures that may be associated with a bonding process may damage any microchip or other semiconductor disposed on or in a card body. To minimize this risk, the back panel may be positioned on the card body such that the high temperatures and pressures of the binding process do not damage the microchip. Positioning the back panel below a signature panel may avoid damage to a microchip during the milling process. For example, a back panel may have a size of 3.056 in by 0.829 in. A back panel may be bonded to a card body such that the distance from the bottom of the card body to the bottom of the back panel is 0.13 in. A back panel may be bonded to a card body such that the distance from the bottom of the card body to the bottom of the back panel is less than 0.13 in. A back panel may be bonded to a card body such that the distance from the top of the card body to the top of the back panel is 1.171 in. A back panel may be bonded to a card body such that the distance from the top of the card body to the top of the back panel is less than 1.171 in. A back panel may be bonded to a card body such that the distance from each side of the card body to each side of the back panel is 0.159 in. A back panel may be bonded to a card body such that the distance from each side of the card body to each side of the back panel is less than 0.159 in or more than 0.159.

A microchip may be disposed onto a card body in a variety of ways. A card body may have material removed across an area to accommodate a microchip. For example, a pocket may be milled into the card body. A pocket may be milled so that a microchip may sit flush with the surface of the card body. An adhesive may be disposed in the pocket or on the microchip prior to positioning a microchip into a pocket in a card body. Any suitable adhesive may be used. For example, ABLE-BOND 931-1T1N1 may be used for this purpose. Further, in various embodiments, an insulating material may be disposed in the card body pocket to be positioned between the microchip and the card body so as to electrically insulate the microchip and the card body. An adhesive may act as an insulating material. Any insulator may be used for this purpose. Insulating properties may be beneficial as when the card body is made of metal, contact between the card body and some kinds of microchips may cause an electrical failure.

With reference to FIGS. 15 and 16, a method for making a titanium transaction card is disclosed. Although titanium is used for illustration purposes, in various embodiments, transaction cards are constructed of any material or combination of materials such as, for example, stainless steel and/or aluminum, as described herein. Any of the steps shown in FIGS. 15 and 16 may be performed by one or more parties and in one or more locations. With reference to FIG. 15, titanium plates 1501 and titanium strips 1502 may be comprised any material comprising titanium. For example, titanium plates 1501 and titanium strips 1502 may comprise pure titanium and/or various titanium alloys. Titanium plates 1501 may be of any thickness described herein, for example, between 4 mils to 40 mils thick, and in various embodiments titanium plates 1501 are 30 mils thick. Titanium plates 1501 may be precut to the exact dimensions of a standard transaction card or the approximate dimensions of a standard transaction card (e.g., less than 3.5 inches in length and less than 2.25 inches in width), but in various embodiments titanium plates 1501 are two or more times the size of a standard transaction card such that two or more standard transaction cards may be cut from one of titanium plates 1501. Titanium strips 1502 are suitable for use as fill panels, as described in detail herein, and may be precut to the approximate dimensions of a finished fill panel (e.g., about 3.056 in by about 0.829 in, or any dimension such that the surface area of the fill panel is less than a standard transaction card). In various embodiments, titanium strips 1502 are sized so that multiple finished fill panels may be formed from titanium strips 1502. In various embodiments, titanium strips 1502 have varying thicknesses, for example from about 1 mil to about 30 mils thick, and in various embodiments, titanium strips 1502 are about 15 mils thick.

Titanium plates 1501 may be surface finished in surface finishing step 1504. For example, a surface of a titanium plate 1501 may be ground, sanded, polished, buffed, and/or otherwise worked to produce a suitable surface. Similar surface finishing may be performed on titanium strips 1502 in surface finishing step 1506. Titanium plates 1501 and titanium strips 1502 may be cleaned with a solvent, surfactant, wax, and/or other cleaning agent.

Titanium plates 1501 may be cut into card bodies in cutting step 1508. Cutting may be performed using any method described herein, for example by the methods contemplated by step 108. For example, common methods of cutting titanium include water jet cutting, die cutting, laser cutting and plasma cutting. Titanium strips 1502 may be cut in cutting step 1510 using any of the methods disclosed for use in step 1508.

Titanium plates 1501 may then have an embossing pocket machined into one surface in machining step 1512. An embossing pocket as used herein may also be referred to as a rear pocket. Machining step 1512 may comprise milling, drilling, mortising, shaving, routing, grinding or any other method by which titanium may be removed to form a pocket. In various embodiments, the embossing pocket comprises a bottom surface and two or more side surfaces. The embossing pocket may be of varying depth, from about 1 mil to about 30 mils, and in various embodiments the embossing pocket has a depth of about 15 mils. In various embodiments, the embossing pocket has the same depth as titanium strips 1502.

Figure 14A:
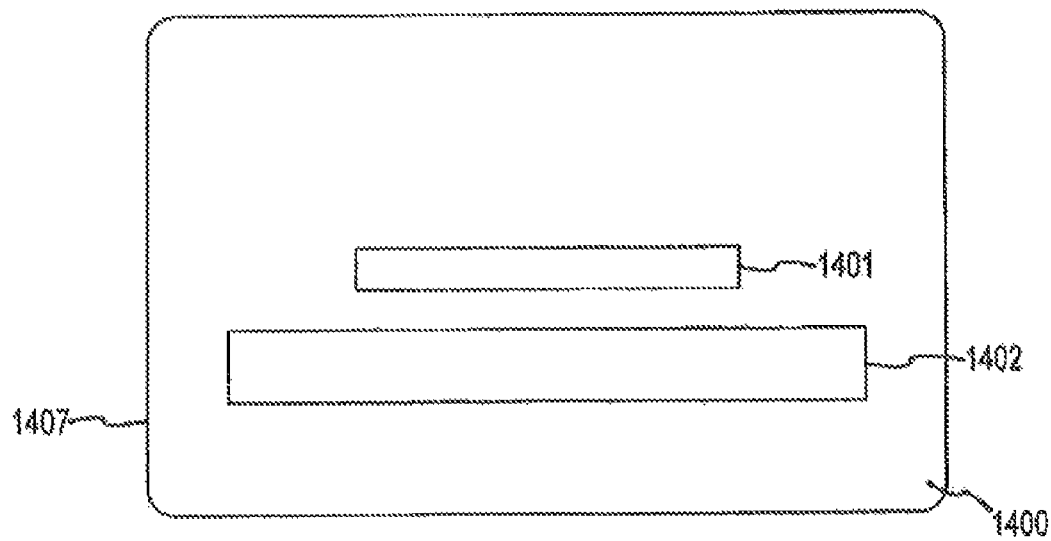
FIGS. 14A-14C illustrate a metal transaction card.
Figure 14B:
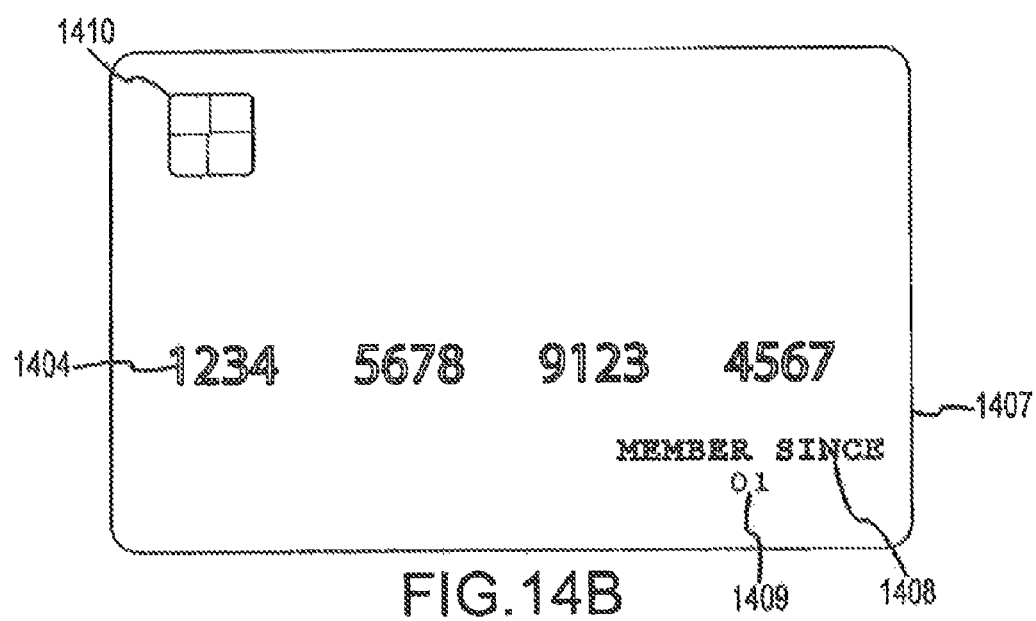
Figure 14C:
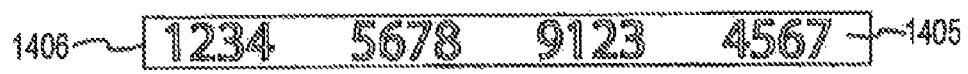

In various embodiments, a face pocket is machined into titanium plates 1501 in machining step 1514. The machining of step 1512 may comprise any method disclosed with respect to step 1510. In various embodiments, the face pocket is disposed on a surface opposite the embossing pocket. The face pocket may be of varying depth, from about 1 mil to about 20 mil. In various embodiments, machining step 1514 is used to create pocket 1410, as shown in FIG. 14B.

Titanium plates 1501 and titanium strips 1502 may be coated via PVD in PVD coating step 1516, as described above. Titanium nitride and/or titanium carbonitride may be used to coat titanium plates 1501 and titanium strips 1502. Coating titanium plates 1501 and titanium strips 1502 may provide protection to the titanium and, in various embodiments, imparts a black finish on the titanium. PVD coating step 1516 produces coated titanium card bodies 1517 and coated titanium strips 1518.

In various embodiments, coated card bodies 1517 and coated titanium strips 1518 may undergo separate processing. Coated card bodies 1517 may have magnetic stripes applied in magnetic strips application step 1522. Magnetic stripes are a form of recordable media and may be applied using any known adhesive. Magnetic stripes may be configured to contain various account information, including account number and account holder name.

Signature panels may be applied to coated titanium card bodies 1517 in signature panel application step 1524. Signature panels may be applied using an adhesive suitable for bonding to metal surfaces. Signature panels may comprise a writable surface such as, for example writable with pencil or ink.

Coated titanium card bodies 1517 may be engraved in engraving step 1528. Engraving step 1528 includes engraving by conventional means, but engraving as used with reference to engraving step 1528 also includes laser and acid etching. Any information or design may be disposed on coated titanium card bodies 1517 in engraving step 1528. For example, account information and company branding (including logos or trademarks/tradenames) may be engraved on coated titanium card bodies 1517 in engraving step 1528.

In various embodiments where coated card bodies 1517 comprise a face pocket, a microchip may be disposed in the face pocket in chip embedding step 1532. An adhesive may be disposed in the face pocket or on the microchip prior to positioning the microchip into the face pocket. In various embodiments, the microchip is disposed in a coated card body 1517 such that the microchip is substantially flush with one surface of the coated card body 1517. Any suitable adhesive may be used to dispose the microchip into the face pocket. For example, ABLEBOND 931-1T1N1 may be used for this purpose. Further, in various embodiments, an insulating material may be disposed in the card body pocket to be positioned between the microchip and the card body so as to electrically insulate the microchip and the card body. An adhesive may act as an insulating material. Any suitable insulator may be used for this purpose. Insulating properties may be beneficial as contact between the card body and some kinds of microchips may cause an electrical failure. An adhesive tape may be disposed on coated titanium strips 1518 in adhesive application step 1534. Any suitable adhesive or adhesive tape may be used, including any adhesive tape that is suitable for bonding to metal surfaces. In various embodiments, heat activated adhesive tape and/or heat activated adhesive is used.

Coated titanium strips 1518 may be stamped in stamping step 1536. For example, coated titanium strips 1518 may be stamped using a press to provide compression and shaping. In various embodiments, stamping may alter the dimensions of coated titanium strips 1518.

With reference to FIG. 16, magnetic stripe encoding may be performed in magnetic stripe encoding step 1601. As discussed above, magnetic stripe may be encoded with account information. Encoding may be performed using any means now known or developed hereafter.

Coated titanium card bodies 1517 may be embossed in embossing step 1602. Embossing may comprise the use of a stamp under pressure and/or heat to press characters into coated titanium card body 1517. Embossing may create embossed characters that protrude from one surface of coated titanium card body 1517 and corresponding indented characters on another surface of coated titanium card body 1517. For example, embossing step 1602 may be used to form embossed characters 1404, as shown FIG. 14B, and characters 562, as shown in FIG. 12. Any suitable stamp may be used in embossing. For example, a stamp may comprise a metal die shaped in the form of numeric and/or alphanumeric characters. Embossing may be performed within the embossing pocket. Because embossing through the embossing pocket entails embossing through less titanium material in contrast to embossing through the entire thickness of coated titanium card bodies 1517, lower embossing pressures may be used. Embossing through the entire thickness of coated titanium card body 1517 entails using embossing pressures that may lead to unacceptable and/or irreversible deformation of coated titanium card body 1517. By embossing through the embossing pocket, less pressure is needed and coated titanium card body 1517 may remain substantially intact.

Although embossing through the embossing pocket, as described herein, may include less pressure than embossing through the entire thickness of coated titanium card body 1517, embossing step 1602 may cause coated titanium card body 1517 to deform or bow to some degree. Debowing step 1603 may be used to remove bowing and/or other deformity from coated titanium card body 1517. Debowing 1603 may be performed using any suitable machinery, such as a press or card flattener.

Embossed characters formed during embossing 1602 may be milled in milling step 1604 to smooth the embossed characters. Milling may comprise polishing, brushing, grinding, or any use of an abrasive to smooth, grind, abrade, or finish the embossed characters. In various embodiments, milling 1604 removes at least a portion of the coating on the embossed characters.

The embossing pocket of coated titanium card body 1517 may be filled with a fill panel, for example, coated titanium strip 1518, in applying insert step 1605 to produce an assembled card. The filling of the embossing pocket may be performed in any suitable manner. For example, hot pressing or hot stamping may be used to bond coated titanium strip 1518 to the embossing pocket. Hot pressing or hot stamping may be useful in embodiments where a heat activated adhesive tape is applied to coated titanium strip 1518, such as, for example, that which may be performed in step 1534. In various embodiments, after filling step 1605, the fill panel provides a substantially flush surface on a surface of the transaction card. For example, with reference to FIG. 12, titanium transaction card 550 is depicted with inset fill panel 560 disposed within embossing pocket 552, providing a substantially flush surface on a surface of transaction card 550. In various embodiments, once disposed in the embossing pocket, a surface of the fill panel is in uniform, direct contact with an interior surface of the pocket. It is understood that a surface of the fill panel and an interior surface of the pocket may be considered to be in uniform, direct contact in embodiments where an adhesive or adhesive tape is used to join the two surfaces and in embodiments where only heat and pressure act to join the two surfaces.

An assembled card may be polished in polishing step 1606. Polishing may be performed in any suitable manner, for example, as described above. Polishing 1606 may be performed with various solvents, surfactants, and/or polishes, although it in various embodiments the materials used in polishing 1606 will be minimally reactive (if at all) to both titanium any coating on the assembled card, in various embodiments, wax is used to polish an assembled card.

It should be noted that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

Benefits, other advantages, and solutions to problems have been described herein with regard to specific embodiments. However, the benefits, advantages, solutions to problems, and any elements that may cause any benefit, advantage, or solution to occur or become more pronounced are not to be construed as critical, required, or essential features or elements of the invention. The scope of the invention is accordingly to be limited by nothing other than the appended claims, in which reference to an element in the singular is not intended to mean "one and only one" unless explicitly so stated, but rather "one or more." Moreover, where a phrase similar to at least one of A, B, and C is used in the claims, it is intended that the phrase be interpreted to mean that A alone may be present in an embodiment, B alone may be present in an embodiment. C alone may be present in an embodiment, or that any combination of the elements A, B and C may be present in a single embodiment; for example, A and B, A and C, B and C, or A and B and C. Although the invention has been described as a method, it is contemplated that it may be embodied as computer program instructions on a tangible computer-readable carrier, such as a magnetic or optical memory or a magnetic or optical disk. All structural, chemical, and functional equivalents to the elements of the above-described exemplary embodiments that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A method comprising:
    forming characters within a pocket on a first surface of a single transaction card; and
    inserting a panel into the pocket, wherein a second surface of the panel is in contact with an interior of the pocket.

2. The method of claim 1, wherein an entire surface of the single transaction card is comprised of a continuous metal layer.

3. The method of claim 2, wherein the continuous metal layer comprises at least one of titanium, aluminum or stainless steel.

4. The method of claim 2, further comprising coating the continuous metal layer via physical vapor deposition.

5. The method of claim 4, wherein the physical vapor deposition deposits titanium nitride on the continuous metal layer.

6. The method of claim 1, further comprising milling the characters.

7. The method of claim 1, wherein the second surface is in uniform, direct contact with the interior of the pocket.

8. The method of claim 1, wherein the single transaction card further comprises a face pocket and further comprising disposing a microchip in the face pocket.

9. The method of claim 1, wherein the panel comprises at least one of titanium, aluminum or stainless steel.

10. The method of claim 1, wherein the panel provides a substantially flush surface on a second surface of the single transaction card.

11. A method comprising:
    applying a magnetic strip to a single transaction card;
    wherein the single transaction card has a rear pocket,
    wherein the single transaction card is configured to allow characters to be formed within the rear pocket on a first surface of the single transaction card,
    wherein the single transaction card is configured to have a panel disposed within the rear pocket,
    wherein a second surface of the panel is configured to he in contact with an interior of the rear pocket.

12. The method of claim 11, further comprising applying a signature panel.

13. The method of claim 11, wherein the single transaction card is comprised of a continuous metal layer.

14. The method of claim 13, wherein the continuous metal layer comprises at least one of titanium, aluminum or stainless steel.

15. The method of claim 13, further comprising coating the continuous metal layer via physical vapor deposition.

16. The method of claim 15, wherein the physical vapor deposition deposits titanium nitride on the continuous metal layer.

17. A method comprising:
    inserting a microchip into a face pocket on a single transaction card;
    wherein the single transaction card has a rear pocket;
    wherein the single transaction card is configured to allow characters to be formed within the rear pocket on a first surface of the single transaction card,
    wherein the single transaction card is configured to have a panel disposed within the rear pocket,
    wherein a second surface of the panel is configured to be in contact with an interior of the rear pocket.

18. The method of claim 17, further comprising applying a magnetic strip to a single transaction card.

19. The method of claim 17, further comprising a coating disposed on the continuous metal layer by physical vapor deposition.

20. The method of claim 17, wherein said coating comprises titanium nitride.

* * * * *